United States Patent [19]
Yamazaki

[11] Patent Number: 5,877,539
[45] Date of Patent: Mar. 2, 1999

[54] BIPOLAR TRANSISTOR WITH A REDUCED COLLECTOR SERIES RESISTANCE

[75] Inventor: Toru Yamazaki, Tokyo, Japan

[73] Assignee: NEC Corporation, Tokyo, Japan

[21] Appl. No.: 727,088

[22] Filed: Oct. 7, 1996

[30] Foreign Application Priority Data

Oct. 5, 1995 [JP] Japan .................................... 7-282388

[51] Int. Cl.⁶ .......................... H01L 29/00; H01L 27/082
[52] U.S. Cl. .......................... 257/514; 257/515; 257/518; 257/588
[58] Field of Search .................................... 257/565, 588, 257/514, 515, 518

[56] References Cited

U.S. PATENT DOCUMENTS

| | | | |
|---|---|---|---|
| 4,910,572 | 3/1990 | Kameyama | 257/565 |
| 4,949,151 | 8/1990 | Horiuchi et al. | 257/565 |
| 4,992,843 | 2/1991 | Blossfeld et al. | 257/514 |
| 5,003,365 | 3/1991 | Havemann et al. | 257/514 |

FOREIGN PATENT DOCUMENTS

| | | | |
|---|---|---|---|
| 0 271 599 | 6/1988 | European Pat. Off. | 257/514 |
| 0 303 435 | 2/1989 | European Pat. Off. | 257/565 |
| 63-215068 | 9/1988 | Japan | 257/514 |
| 1-015973 | 1/1989 | Japan | 257/565 |

*Primary Examiner*—Steven H. Loke
*Attorney, Agent, or Firm*—Young & Thompson

[57] ABSTRACT

A collector structure in a bipolar transistor on a semiconductor substrate is surrounded by trench isolations. A well region has a first impurity concentration and extends in an upper portion of the semiconductor substrate surrounded by the trench isolations. The well region is a first conductivity type and a burying layer horizontally extends under the well region. The burying layer is positioned shallower than the bottom of the trench isolations. Collector plug electrodes extend in a vertical direction and along inside walls of the trench isolations. The collector plug electrodes are the first conductivity type and have a second impurity concentration higher than the first impurity concentration. The collector plug electrodes have a bottom level which is about the same as the bottom of the trench isolations. A collector diffusion layer extends in a vertical direction and along inside vertical walls of the collector plug electrodes. The collector diffusion layer has a bottom level which extends horizontally beneath the collector plug electrodes so that the bottom of the collector diffusion layer is deeper than the bottom of the trench isolations so as to have the collector diffusion layer contact the burying layer.

1 Claim, 15 Drawing Sheets

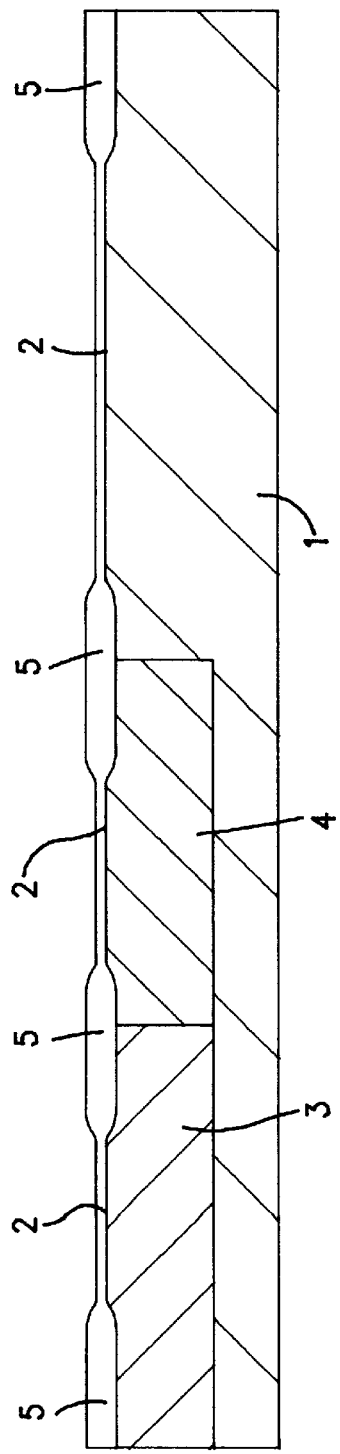
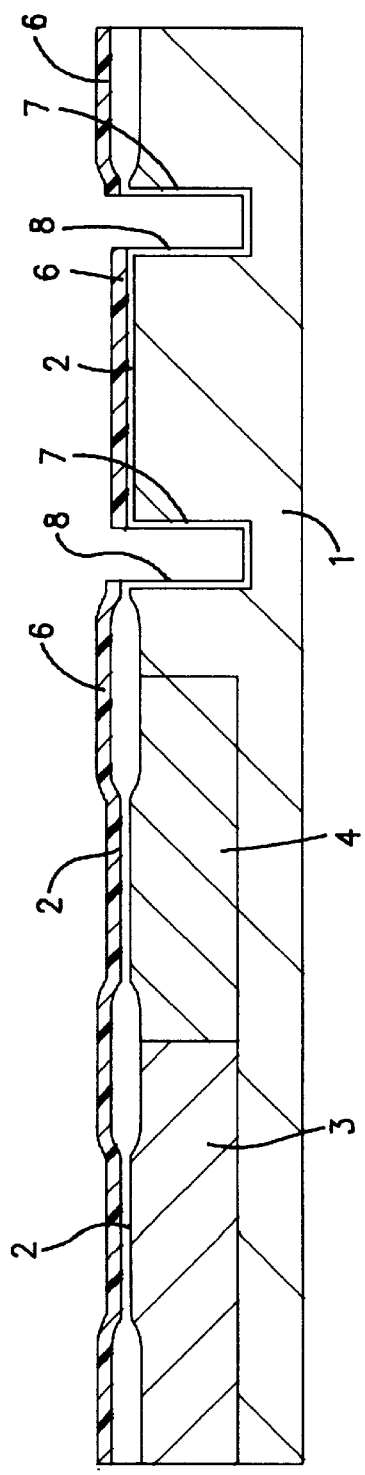
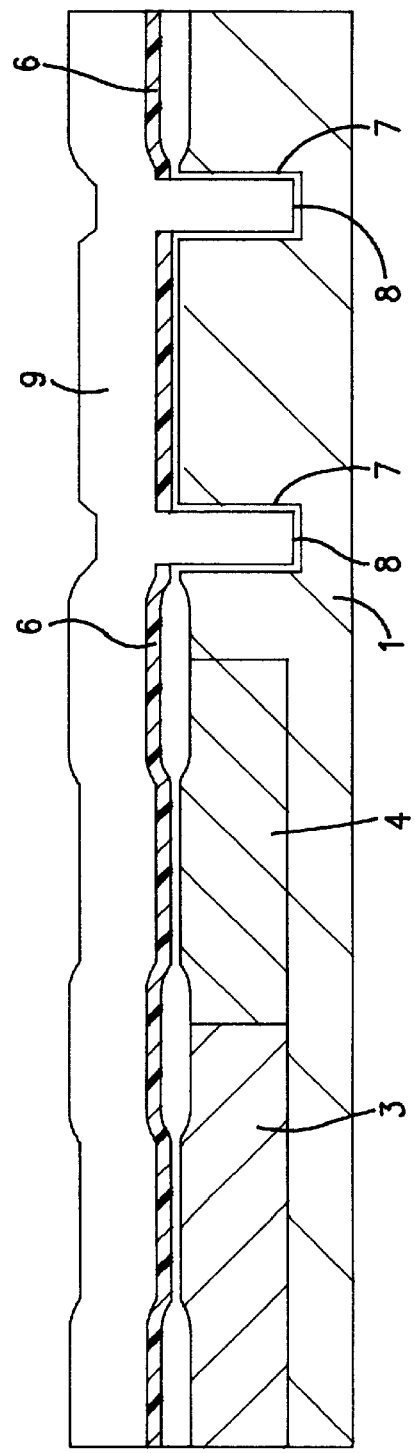

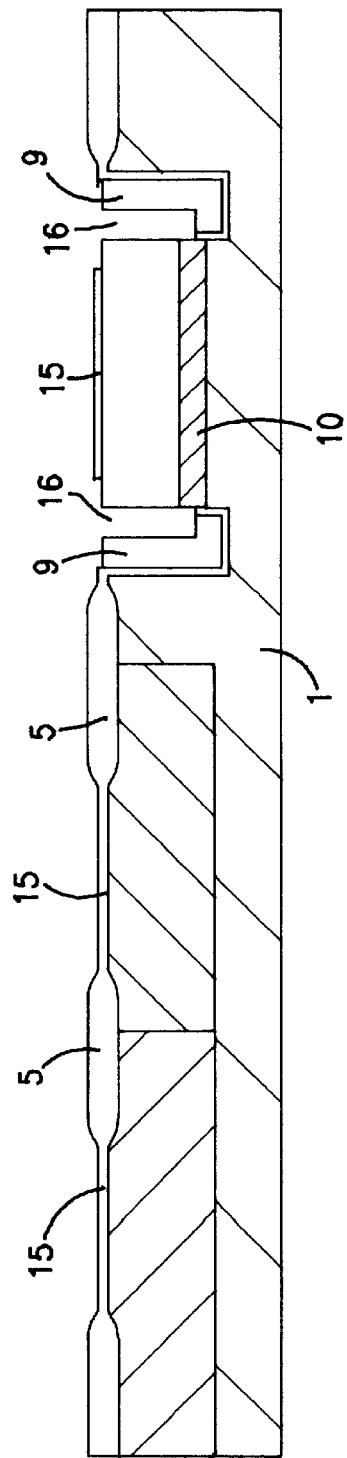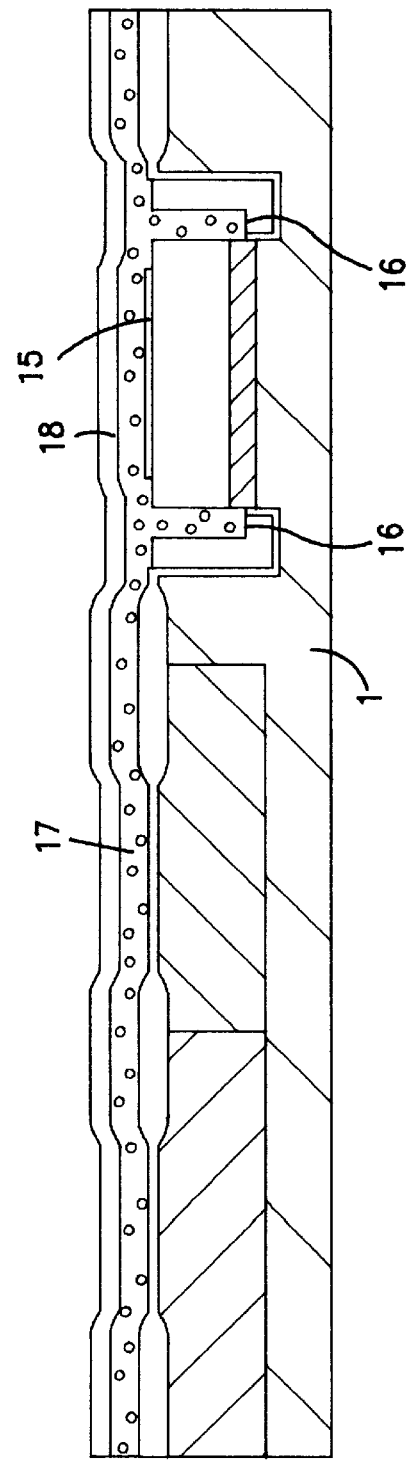

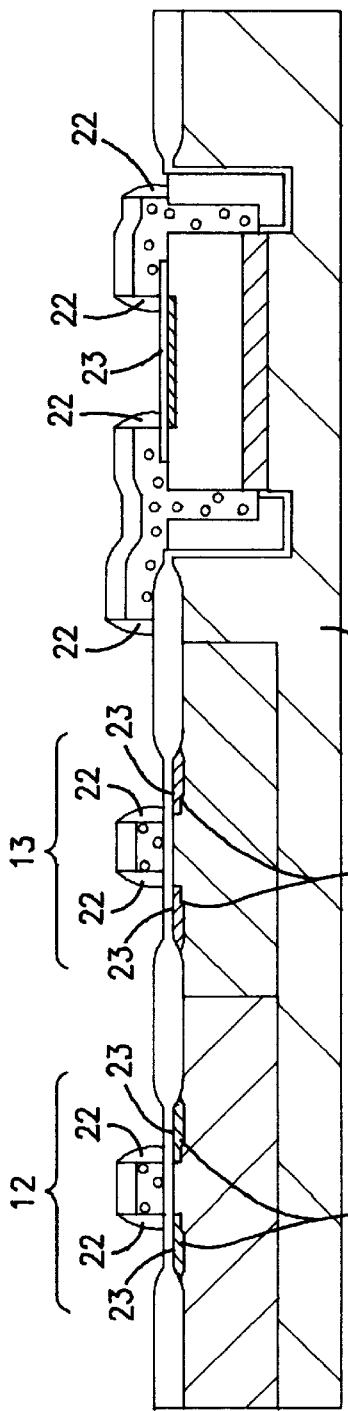
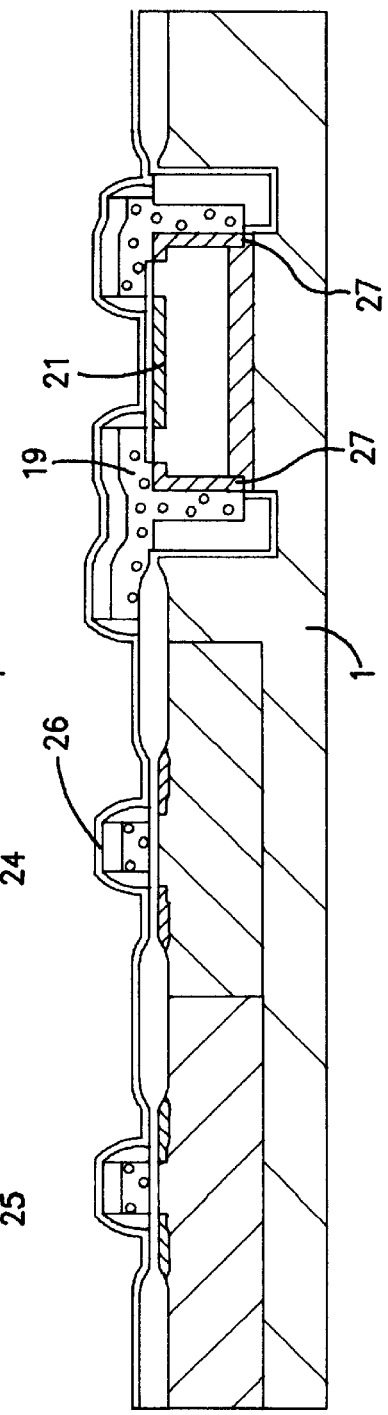
FIG. 4J
FIG. 4K
FIG. 4L

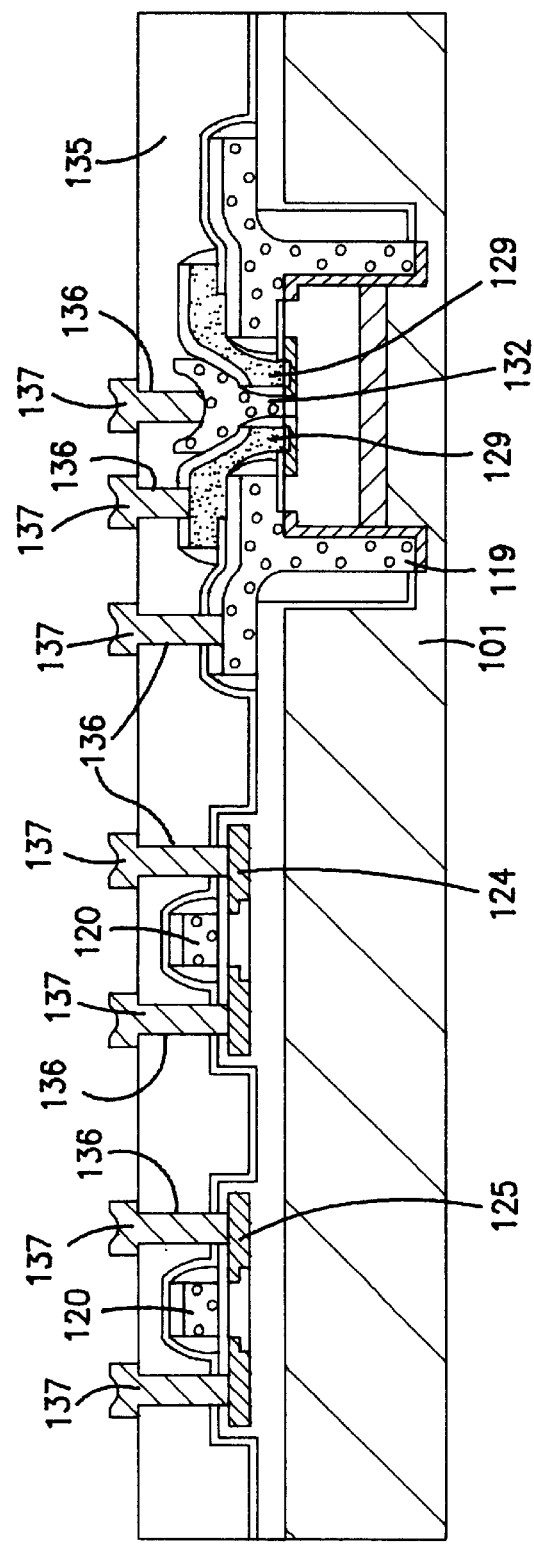

BIPOLAR TRANSISTOR WITH A REDUCED COLLECTOR SERIES RESISTANCE

BACKGROUND OF THE INVENTION

The present invention relates to a bipolar transistor with a reduced collector series resistance and a method for fabricating the same.

In conventional fabrication methods for the bipolar transistors, a burying layer is formed on a semiconductor substrate and an epitaxial layer is grown on the burying layer. In order to shorten these conventional fabrication processes for the bipolar transistors, it was, however, proposed to form an n-type highly doped diffusion layer by an ion-implantation at a high energy in the range of 1 MeV to 2 MeV. In this method, an n-type burying layer and an n-type well layer overlying the n-type burying layer may be formed by use of the same mask but at different ion-implantation energies. This may shorten the fabrication processes for the bipolar transistors. This method for fabricating the bipolar transistor will be described with reference to FIGS. 1A and 1B.

Figure 1A:
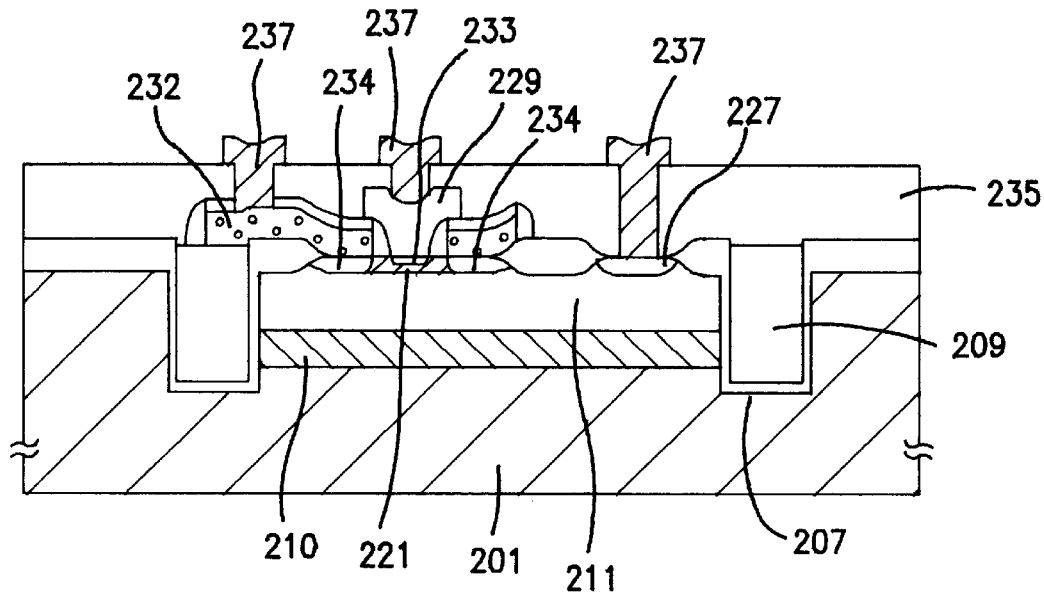
FIG. 1A is a cross sectional elevation view illustrative of the conventional bipolar transistor wherein the n-type burying layer and the n-well layer overlaying the n-type burying layer have been formed by ion-implantation at different energies by use of the same mask.

The bipolar transistor is formed on a p-type semiconductor substrate 201. Trench isolations 209 are formed within trench grooves 207 formed in the p-type semiconductor substrate 201 so that the bipolar transistor is formed in a region surrounded by the trench isolations 209. An $n^+$ burying layer 210 is formed in the p-type semiconductor substrate surrounded by the trench isolations 209 by an ion-implantation of n-type impurity at a high ion-implantation energy. An n-well region 211 is then formed, which overlies the $n^+$ burying layer 210 by a subsequent ion-implantation of n-type impurity at an ion-implantation energy lower than the ion-implantation energy used for forming the $n^+$ burying layer 210. Field oxide films are selectively formed on a surface of the substrate A p-type intrinsic base region 221 is formed in an upper region of the n-well region 211. A collector diffusion layer 227 is selectively formed in an upper portion of the n-well region 211. The collector comprises the $n^+$ burying layer 210, the n-well region 211, and the collector diffusion layer 227.

Graft base regions 234 are formed to surround the intrinsic base region 221. Base plug electrodes 232 are formed, which are in contact with the graft base regions 234. An emitter region 233 is formed in an upper portion of the intrinsic base region 221 to form a vertical n-p-n structure. The emitter region 233 may be formed by diffusion of an n-type impurity from an emitter plug electrode 229 into the intrinsic base region 221. Electrode interconnections 237 are formed in contact holes to be made into contact with the base plug electrodes 232, the emitter plug electrode 229 and the collector diffusion layer 227.

In the above bipolar transistor, a current flows downwardly from the collector diffusion layer 227 through the n-well region 211 to the $n^+$ burying layer 210 and then flows laterally through the $n^+$ burying layer 210 for subsequent flowing upwardly from the n-well region 211 to the intrinsic base region 221. When the bipolar transistor is placed in an active state, a space charge region extends under the intrinsic base region 221 and over the $n^+$ burying layer 210. Namely, the intrinsic base region 221 is connected through the space charge region to the $n^+$ burying layer 210. The space charge region is extremely lower in effective resistivity to current than the n-well region 211. Further, since the $n^+$ burying layer 210 is higher in impurity concentration than the n-well region 211, the $n^+$ burying layer 210 is much lower in effective resistivity to current than the n-well region 211. Current tends to flow through a region having a lower resistivity than other region surrounding the region, for which reason the current flows in a current path which extends through the n-well region 211 as short as possible but through the $n^+$ burying layer 210 as long as possible. As a result, the current path extends downwardly from the collector diffusion region 227 through the n-well region 211 to the $n^+$ burying layer 210 and further extends laterally through the $n^+$ burying layer 210 and moreover extends upwardly from the $n^+$ burying layer 210 through the space charge reign to the intrinsic base region 221. In the current path described above, the space charge region and the $n^+$ burying layer 210 are much lower in effective resistivity to current than the n-well region, for which reason an effective collector series resistance is defined mostly by the resistance of the n-well region 211 under the collector diffusion region 227. Since the thickness of the n-well region 211 is determined in consideration of a base-collector withstand voltage, it is unlikely that the thickness of the n-well region 211 can be reduced. The collector series resistance of the above bipolar transistor is, therefore, substantially defined by the resistance of the n-well region 211 when the current flows from the collector diffusion region 227 to the $n^+$ burying layer 210 downwardly. As described above, the resistivity is defined by the impurity concentration. The $n^+$ burying layer 210 has a high impurity concentration in the order of $1 \times 10^{19}$ atoms/cm$^3$, whilst the n-well region 211 has a lower impurity concentration in the order of $1 \times 10^{13}$ atoms/cm$^3$. If, in order to reduce the resistivity of the n-well region 211, the impurity concentration of the n-well region 211 is increased, then this raises problems with crystal defects caused by crystal damages in ion-implantation at high dose. Remarkable crystal defects cause leakage of current between collector and base or between emitter and collector.

In the above circumstances, it was practically difficult to reduce the collector series resistance to less than 100 Ω. If the collector series resistance is not sufficiently reduced and the bipolar transistor is made to operate in a large collector current region, then the bipolar transistor is likely to be saturated or its cut off frequency lowered, thereby the required good properties can not be obtained.

In order to settle the above problems with a high collector series resistance, there was proposed another bipolar transistor with a lateral n-p-n structure in place of the above vertical n-p-n structure. A typical one of the conventional lateral n-p-n structure bipolar transistors will be described with reference to FIGS. 2A and 2B. This conventional lateral n-p-n structure bipolar transistor is disclosed in the Japanese laid-open patent publication No. 64-15973.

Figure 2A:
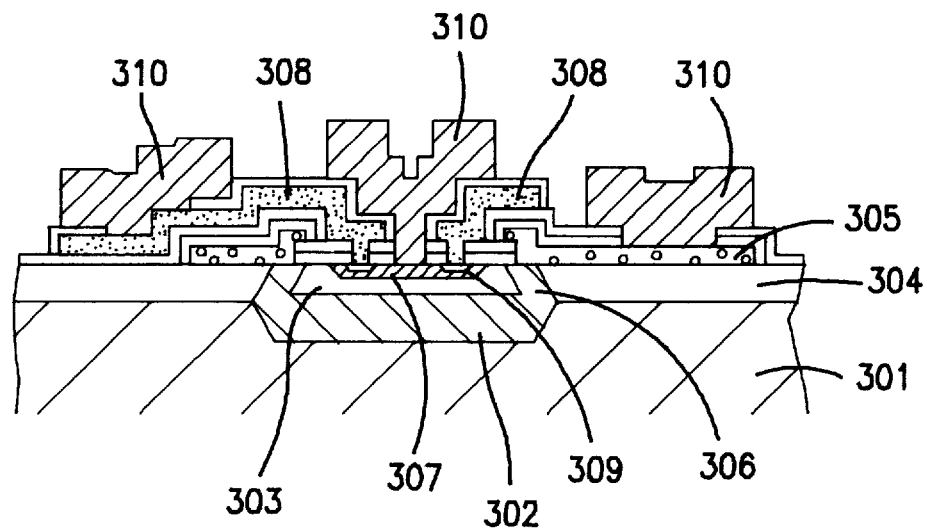

FIG. 2A is a cross sectional elevation view illustrative of the conventional bipolar transistor wherein a highly doped n-type collector diffusion layer laterally surrounds an n-type epitaxial layer which surrounds an intrinsic base region so that a collector plug electrode is connected via the n-type highly doped collector diffusion layer to a highly doped n-type burying layer whereby currents flow from the collector plug electrode through the n-type highly doped collector diffusion layer to the highly doped n-type burying layer.

Figure 2B:
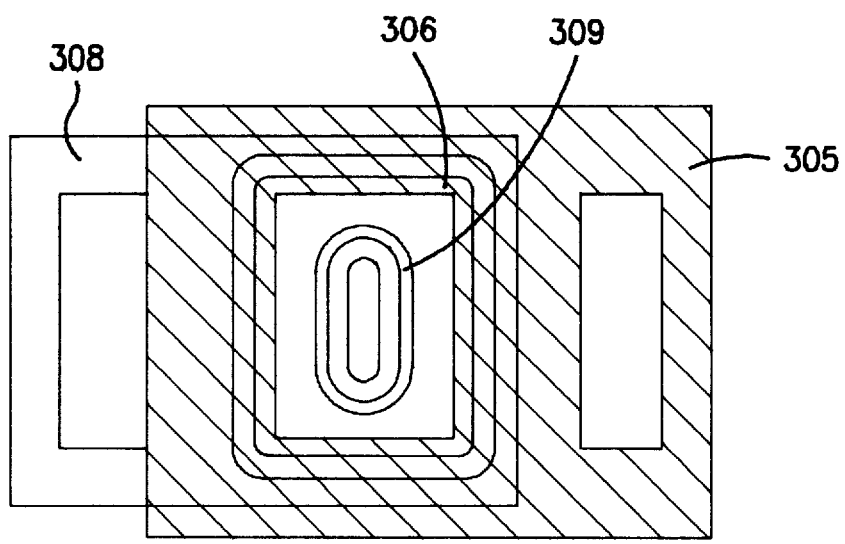

FIG. 2B is a plane view illustrative of the conventional bipolar transistor illustrated in FIG. 2A.

On a p-type semiconductor substrate 301, field oxide films 304 are selectively formed to define an active region on which a bipolar transistor is formed. A highly doped n-type collector diffusion layer 306 is formed to laterally surround an n-type epitaxial layer 303 which surrounds an intrinsic base region 307. A ring-shaped emitter region 309 is formed in an upper portion of the intrinsic base region 307. A collector plug electrode 305 is formed in contact with the n-type highly doped collector diffusion layer 306. An $n^+$ burying layer 302 is formed under the intrinsic base region 307 and under the n-type highly doped collector diffusion layer 306 so that the collector plug electrode 305 is connected via the n-type highly doped collector diffusion layer 306 to the $n^+$ burying layer 302. Currents flow from the collector plug electrode 305 through the n-type highly doped collector diffusion layer 306 to the $n^+$ burying layer 302. The currents then laterally flow through the $n^+$ burying layer 302 and thereafter upwardly flow through a space charge region formed under the intrinsic base region 307 to the intrinsic base region 307, wherein the space charge region is formed only when the bipolar transistor is in active state. The current path comprises the n-type highly doped collector diffusion layer 306, the $n^+$ burying layer 302 and the space charge region under the intrinsic base region 307. Namely, the current path is free of a highly resistive region, for which reason the collector series resistance of the bipolar transistor illustrated in FIGS. 2A and 2B is lower as compared to that illustrated in FIGS. 1A and 1B. The bipolar transistor illustrated in FIGS. 2A and 2B, however, is difficult limitation to lateral scale down due to the following reasons.

The n-type highly doped collector diffusion layer 306 is formed by a diffusion of n-type impurity from the collector plug electrode 305 into the n-type epitaxial layer 303. The diffusion is continued until the impurity reaches the top of the $n^+$ burying layer 302 whereby the collector plug electrode 305 is connected via the n-type highly doped collector diffusion layer 306 to the $n^+$ burying layer 302. Since the impurity diffusion is isotropic, there is both vertical diffusion and lateral diffusion. In consideration of the structure of the bipolar transistor, it is required that the n-type highly doped collector diffusion layer 306 is separated by the n-type epitaxial layer 303 from the intrinsic base region 307. Notwithstanding, the lateral diffusion of impurity from the collector plug electrode 305 forms the n-type highly doped collector diffusion layer 306 which laterally extends from the collector plug electrode 305 toward the intrinsic base region 307. Accordingly, it is essential that the collector plug electrode 305 is spaced in a lateral direction from the intrinsic base region 307 by a distance larger than a lateral diffusion distance. This provides a limitation to the lateral scaling down of the bipolar transistor. The above diffusion process may also limit increases in impurity concentration of the collector diffusion layer 306. Namely, it is difficult to cause the collector diffusion layer 306 to possess an impurity concentration as high as the $n^+$ burying layer 302. This limitation to the increase in the impurity concentration of the collector diffusion layer 306 results in a limitation to a reduction in collector series resistance of the bipolar transistor.

In the above circumstances, it had been required to develop an improved bipolar transistor having a substantially reduced collector series resistance and also having a structure suitable for a substantial space down in lateral directions.

SUMMARY OF THE INVENTION

Accordingly, it is an object of the present invention to provide an improved bipolar transistor free from any problems as described above.

It is a further object of the present invention to provide an improved bipolar transistor having a substantially reduced collector series resistance.

It is a further more object of the present invention to provide an improved bipolar transistor having a structure suitable for a substantial space reduction in lateral directions.

It is another object of the present invention to provide a novel method for forming an improved bipolar transistor free from any problems as described above.

It is still another object of the present invention to provide a novel method for forming an improved bipolar transistor having a substantially reduced collector series resistance.

It is yet another object of the present invention to provide a novel method for forming an improved bipolar transistor having a structure suitable for a substantial space reduction in lateral directions.

It is further another object of the present invention to provide a novel method for forming a trench groove in a semiconductor substrate, which is applicable to the fabrication of the bipolar transistor.

The above and other objects, features and advantages of the present invention will be apparent from the following descriptions.

The present invention provides a collector structure in a bipolar transistor which is formed on a semiconductor substrate and is surrounded by trench isolations. The collector structure comprises the following sections. A well region has a first impurity concentration and extends in an upper portion of the semiconductor substrate surrounded by the trench isolations. The well region is a first conductivity type and has upper region on which a base region is formed. The base region includes an emitter region. A burying layer laterally extends under the well region. The burying layer is the first conductivity type and has a second impurity concentration higher than the first impurity concentration. The burying layer is positioned shallower than the bottom of the trench isolations. Collector plug electrodes extend at least in a vertical direction and along inside walls of the trench isolations. The collector plug electrodes are the first conductivity type and have a third impurity concentration higher than the first impurity concentration. The collector plug electrodes have a bottom level which is at least deeper than the top of the burying layer. A collector diffusion layer extends in a vertical direction and along inside vertical walls of the collector plug electrodes. The collector diffusion layer has a bottom level which is almost the same as the bottom of the collector plug electrodes so that the bottom of the collector diffusion layer is at least deeper than the top of the burying layer so as to have the collector diffusion layer made into contact with the burying layer.

It is possible that the collector plug electrodes extends to the bottom of the trench grooves and the collector diffusion layer also extends to the bottom of the collector plug electrodes.

The present invention also provides a method for forming a collector diffusion layer comprising the step of a thermal diffusion of impurity in a lateral direction from a vertical portion of a collector plug electrode toward a well region surrounded by said collector plug electrode so that said collector diffusion layer has a high impurity concentration and vertically extends along inside vertical walls of a vertical portion of a collector plug electrode, and said collector diffusion layer extends from a surface region of a substrate into at least an intermediate level of a burying layer highly doped with the same impurity as that of said collector diffusion layer.

BRIEF DESCRIPTIONS OF THE DRAWINGS

Preferred embodiments of the present invention will be described in detail with reference to the accompanying drawings.

FIG. 1A is a fragmentary cross sectional elevation view illustrative of the conventional bipolar transistor wherein the n-type burying layer and the n-well layer overlaying the n-type burying layer have been formed by ion-implantation at different energies by use of the same mask.

Figure 1B:
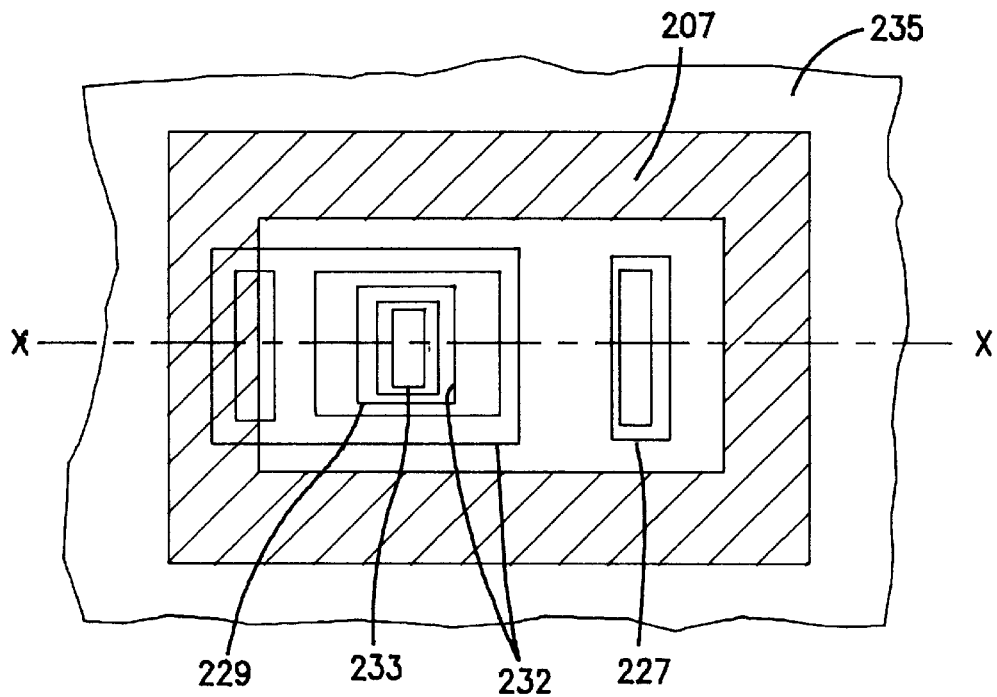
FIG. 1B is a plane view illustrative of the conventional bipolar transistor illustrated in FIG. 1A.

FIG. 1B is a fragmentary plan view illustrative of the conventional bipolar transistor illustrated in FIG. 1A.

FIG. 2A is a fragmentary cross sectional elevation view illustrative of the conventional bipolar transistor wherein a highly doped n-type collector diffusion layer is formed to laterally surround an n-type epitaxial layer which surrounds an intrinsic base region so that a collector plug electrode is connected via the n-type highly doped collector diffusion layer to a highly doped n-type burying layer whereby currents flow from the collector plug electrode through the n-type highly doped collector diffusion layer to the highly doped n-type burying layer.

FIG. 2B is a fragmentary plan view illustrative of the conventional bipolar transistor illustrated in FIG. 2A.

Figure 3A:
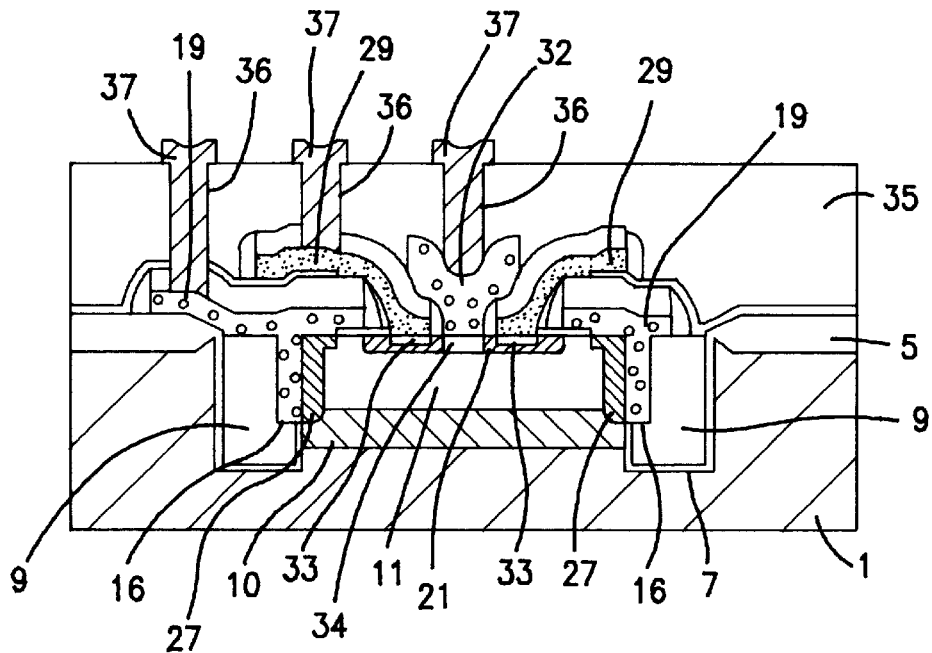

FIG. 3A is a fragmentary cross sectional elevation view illustrative of an improved bipolar transistor in a first embodiment according to the present invention.

Figure 3B:
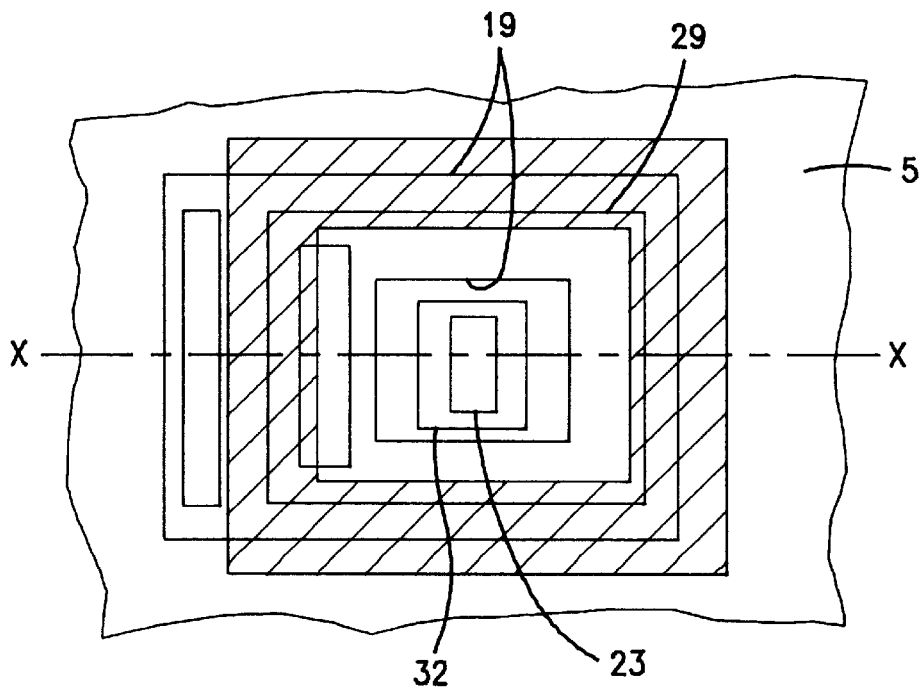

FIG. 3B is a fragmentary plan view illustrative of the conventional bipolar transistor illustrated in FIG. 3A.

Figure 4D:
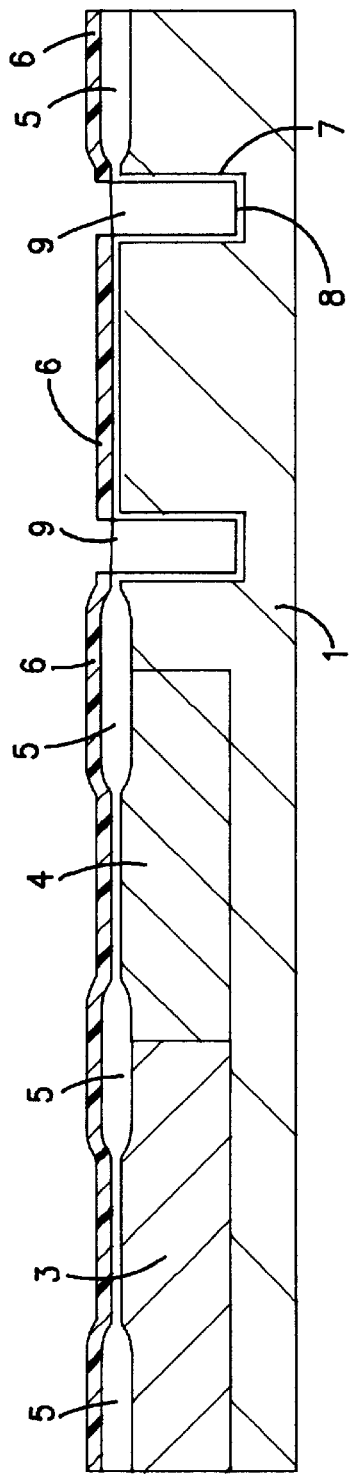
Figure 4E:
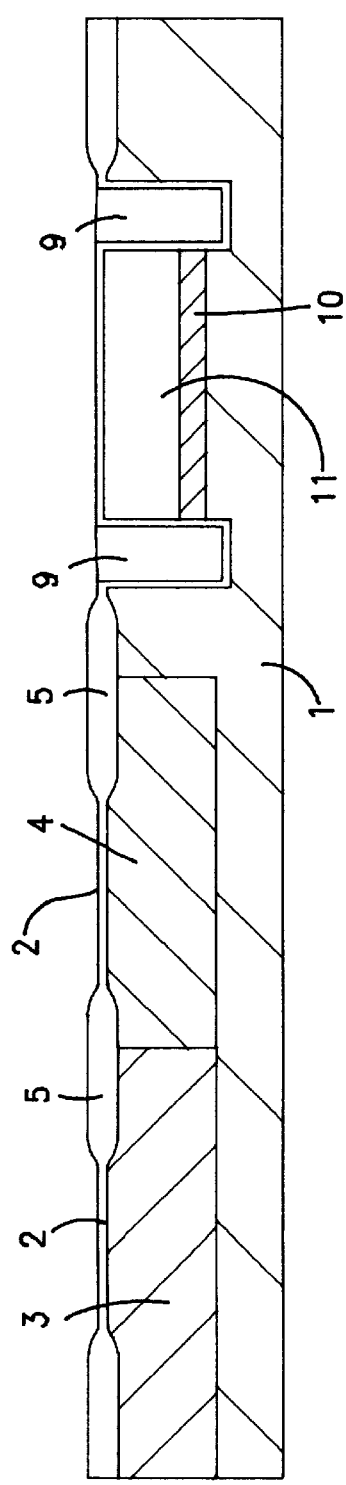
Figure 4F:
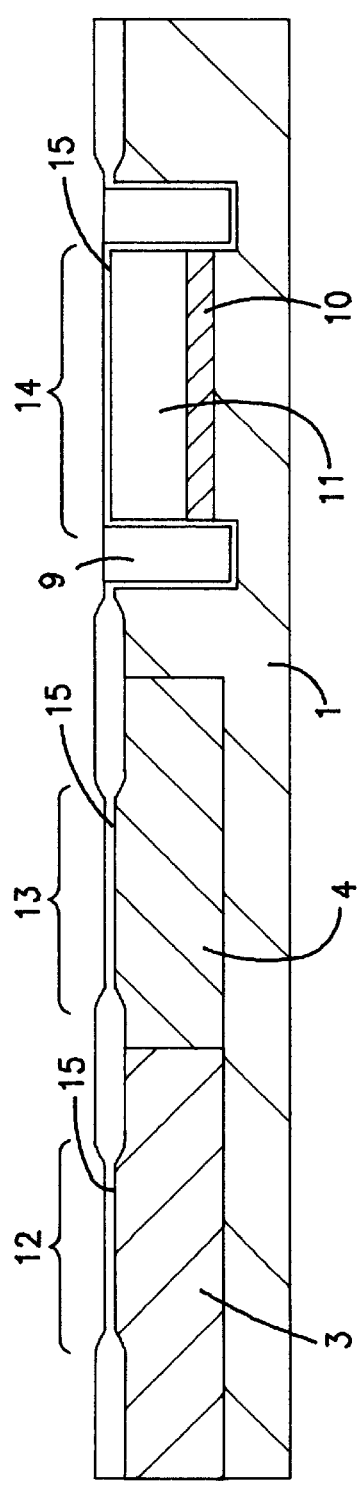
Figure 4M:
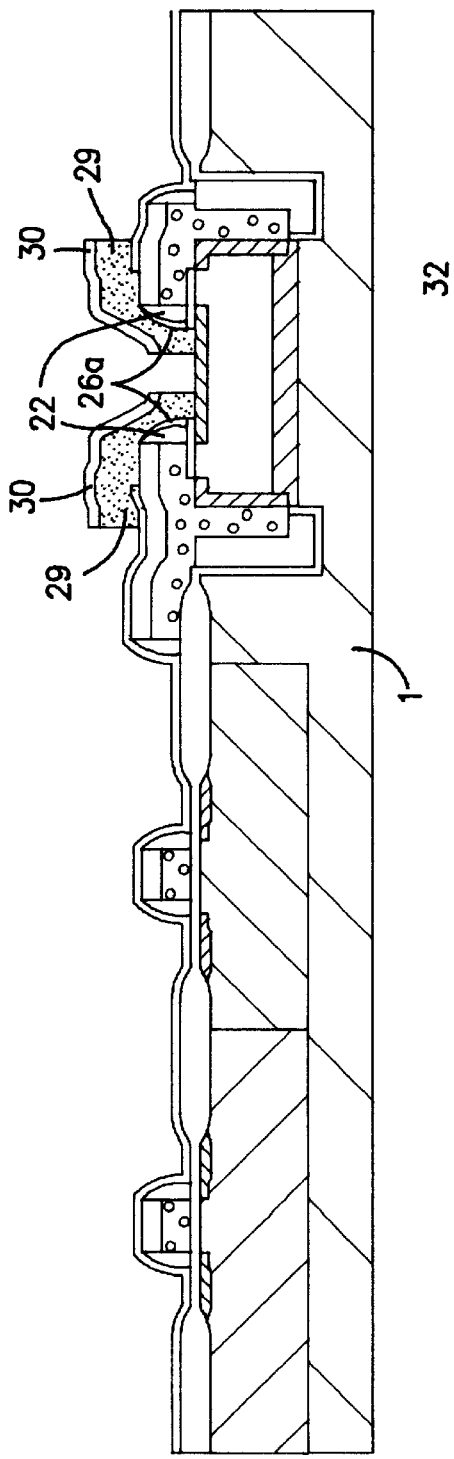
Figure 4N:
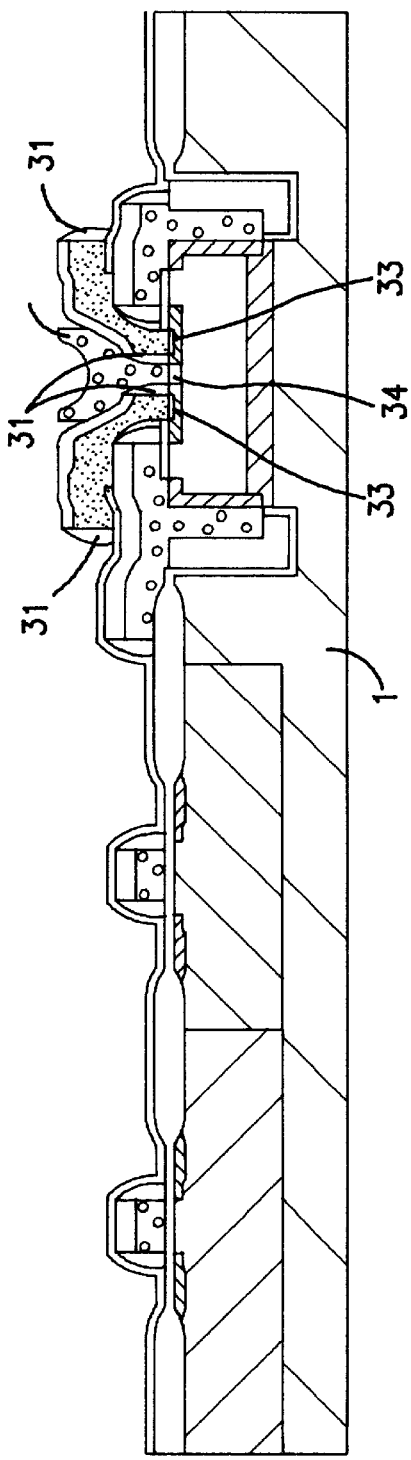
Figure 4O:
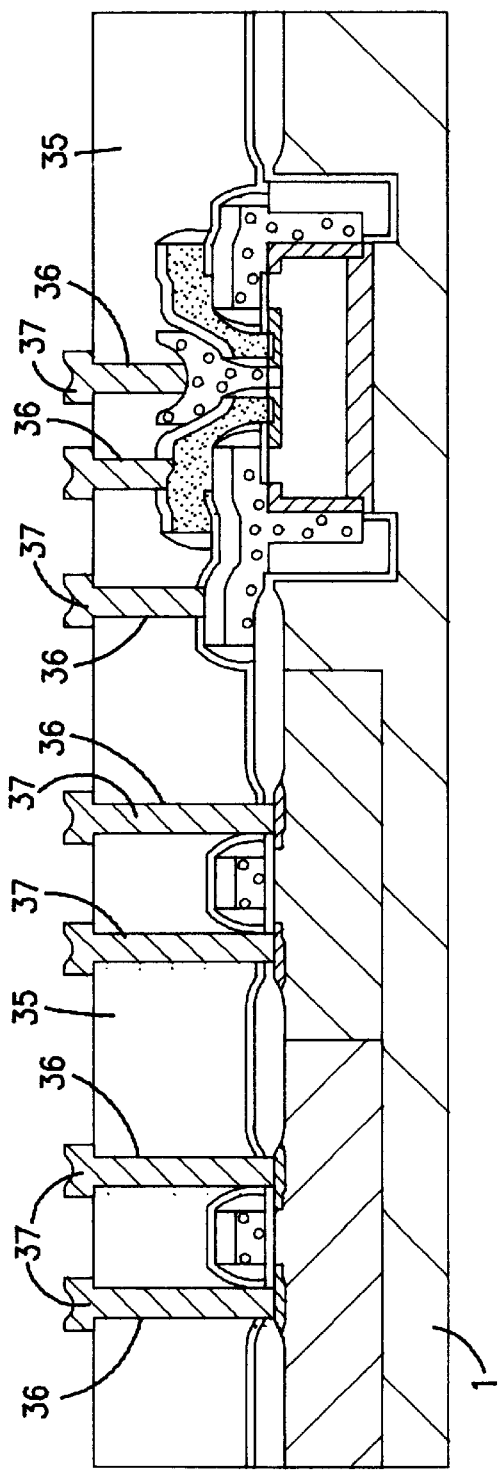

FIGS. 4A through 4O are fragmentary cross sectional elevation views illustrative of an improved bipolar transistor in sequential steps involved in a novel fabrication method therefor in a first embodiment according to the present invention.

Figure 5:
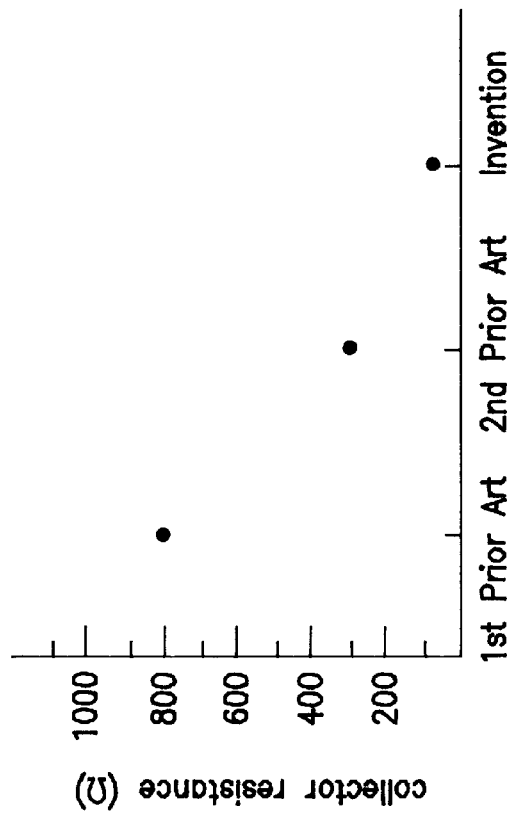

FIG. 5 is a view showing a reduced collector series resistance of an improved bipolar transistor in accordance with the present invention as compared to collector series resistance of the two conventional bipolar transistors illustrated in FIGS. 1A, 1B, 2A and 2B.

FIG. 6 is a fragmentary cross sectional elevation view illustrative of an improved bipolar transistor in a second embodiment according to the present invention.

Figure 7A:
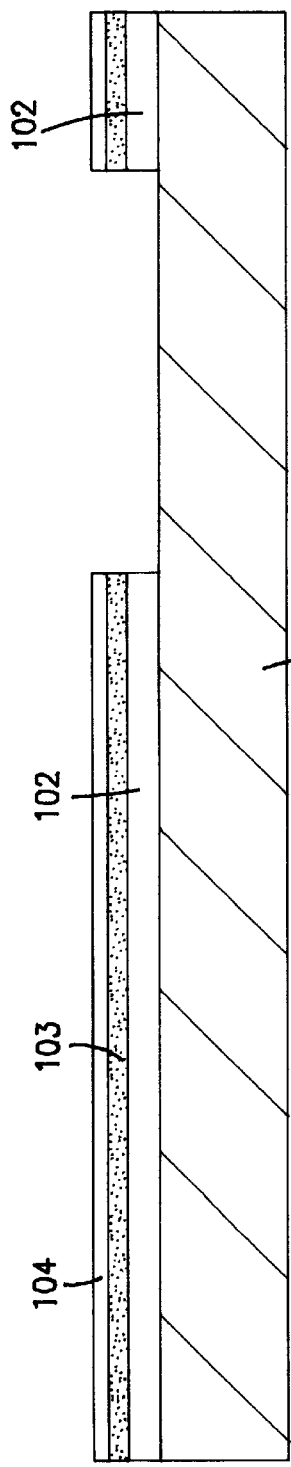
Figure 7B:
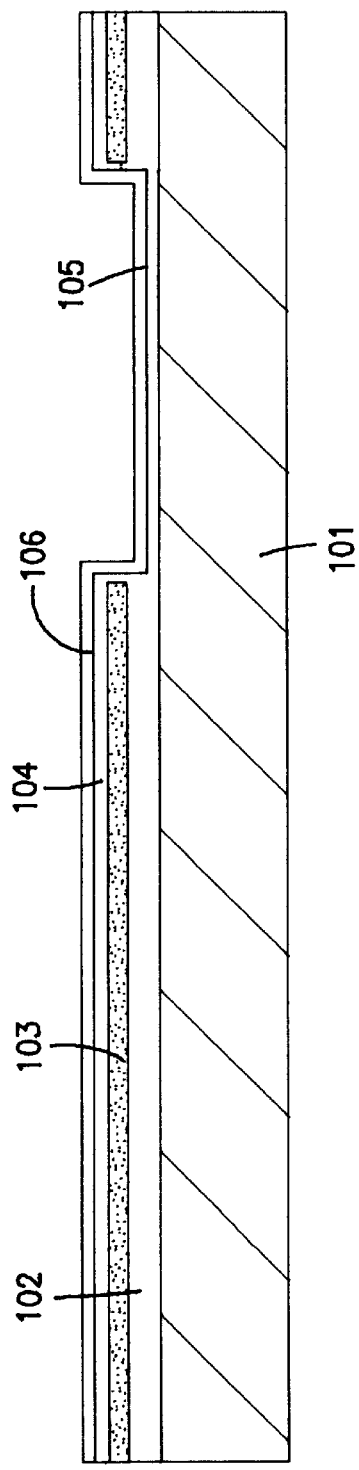
Figure 7C:
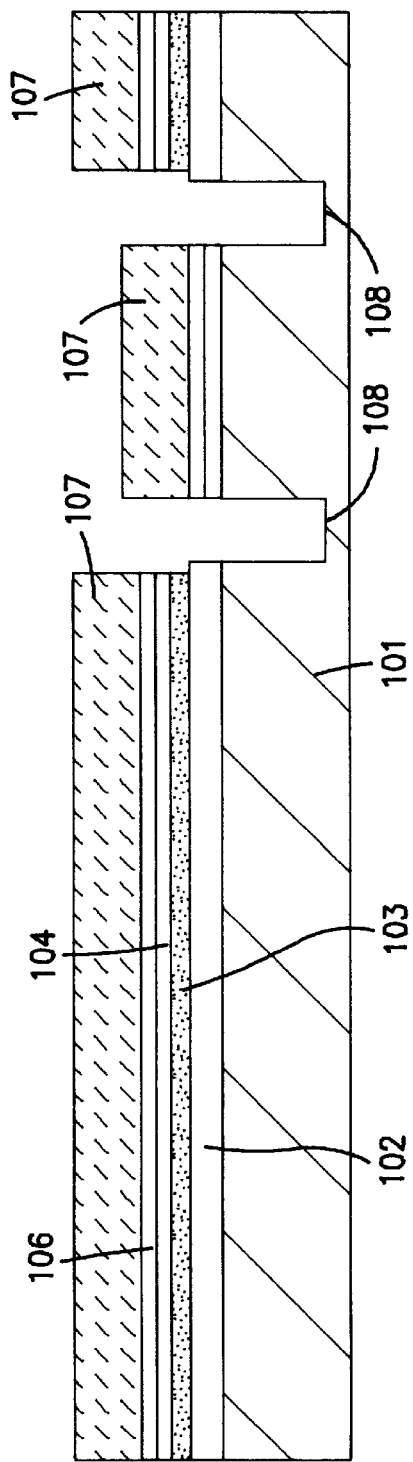
Figure 7D:
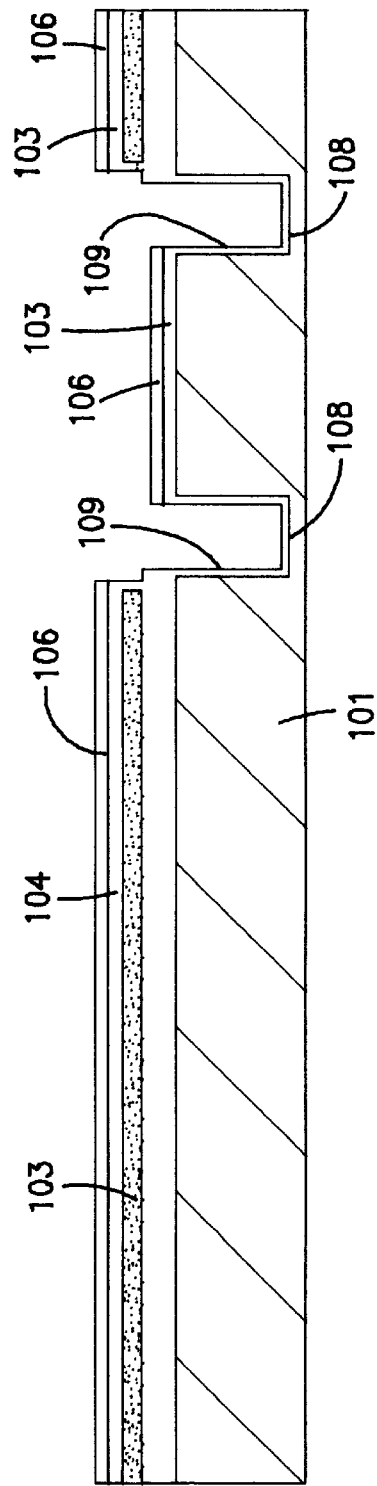
Figure 7E:
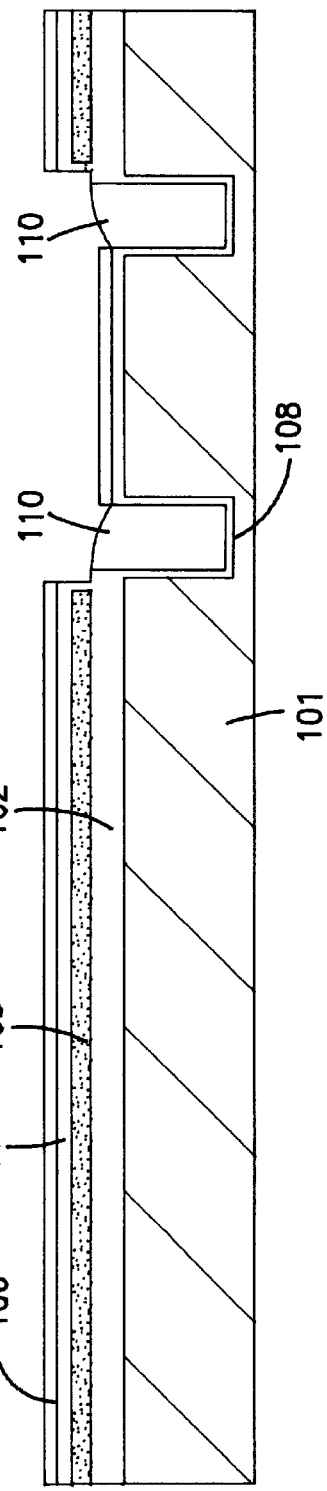
Figure 7F:
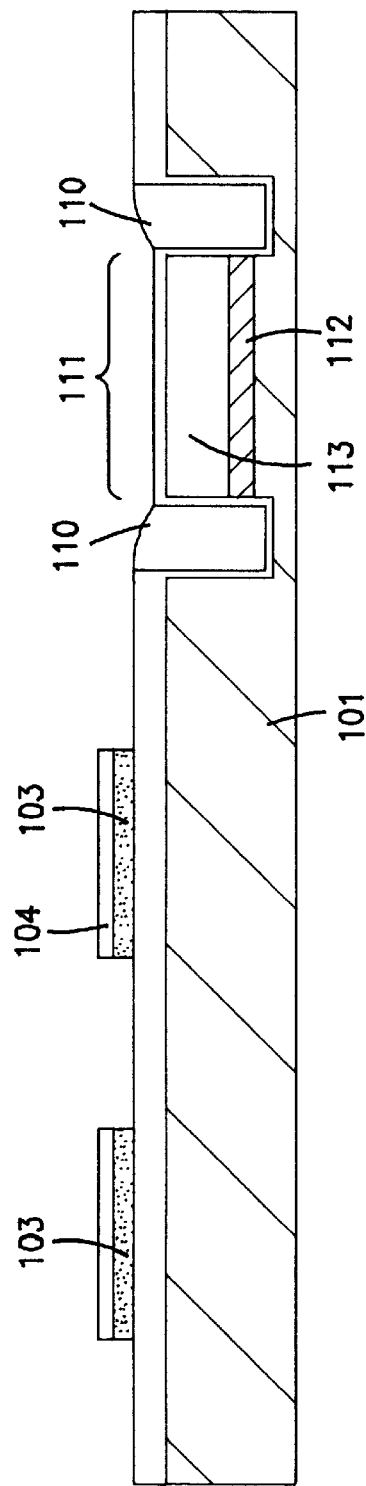
Figure 7G:
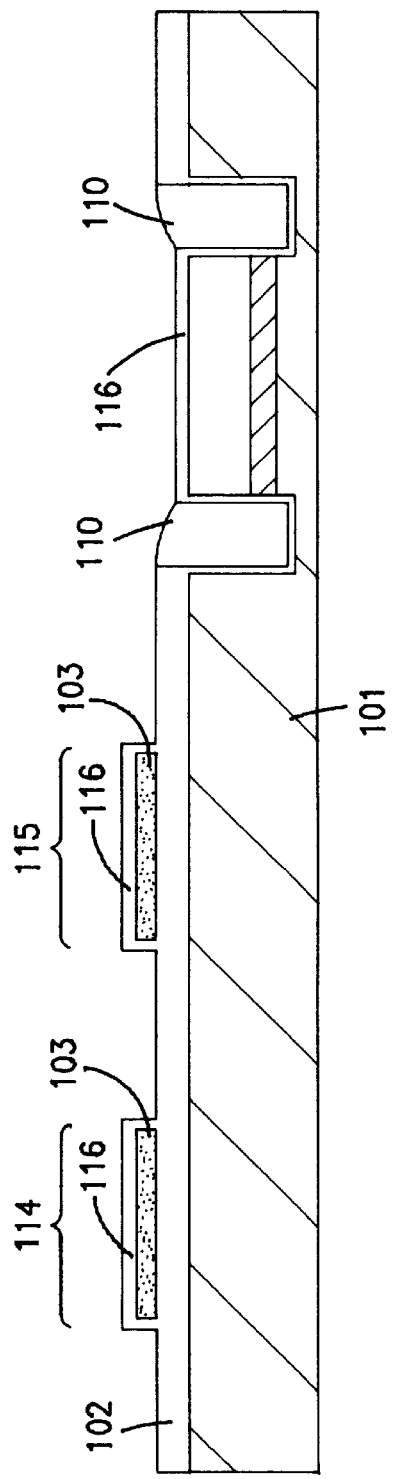
Figure 7H:
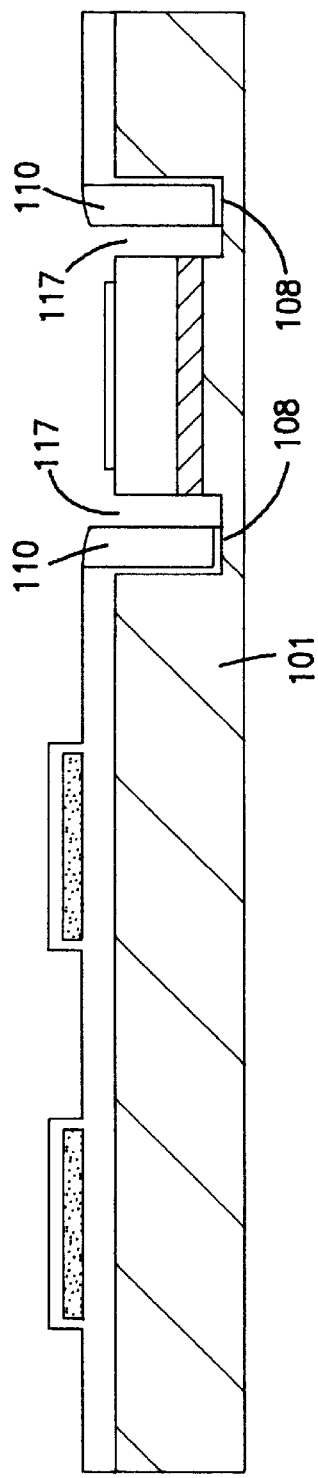
Figure 7I:
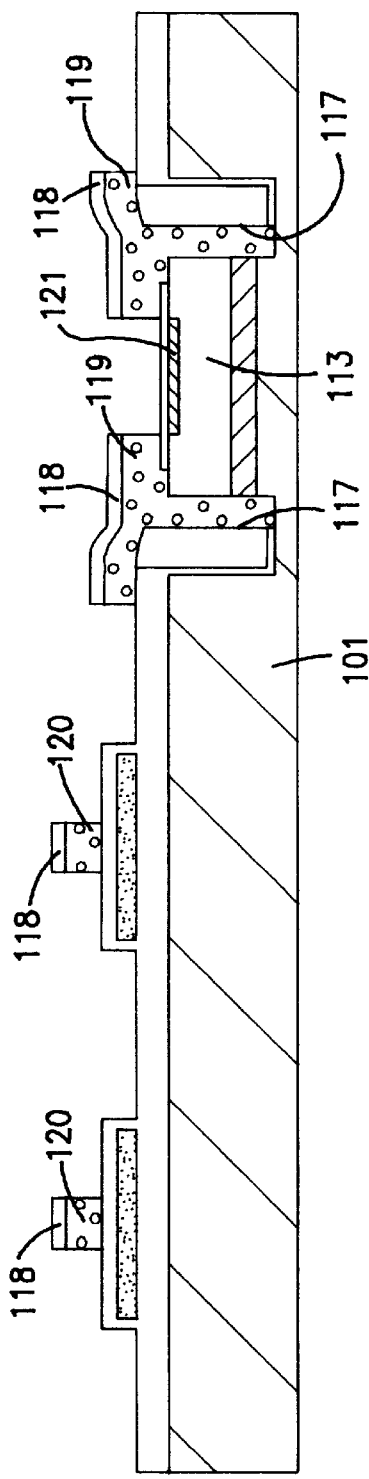
Figure 7J:
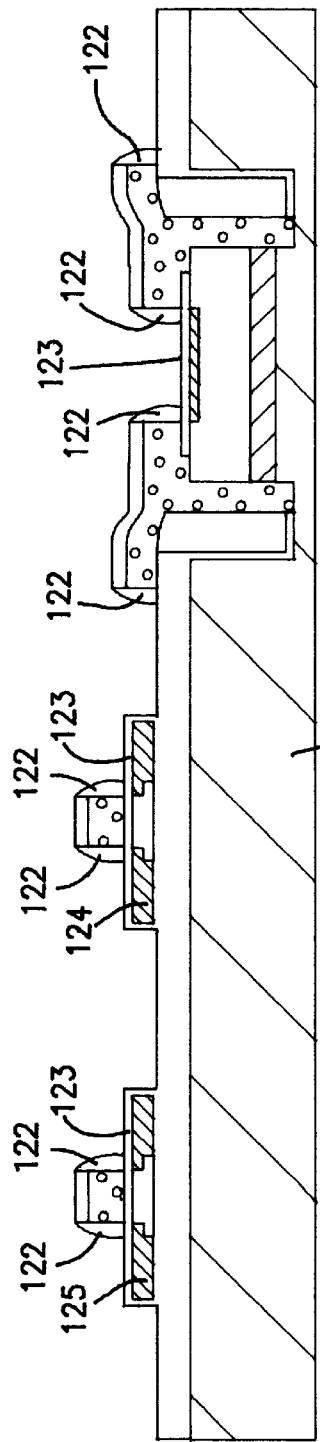
Figure 7K:
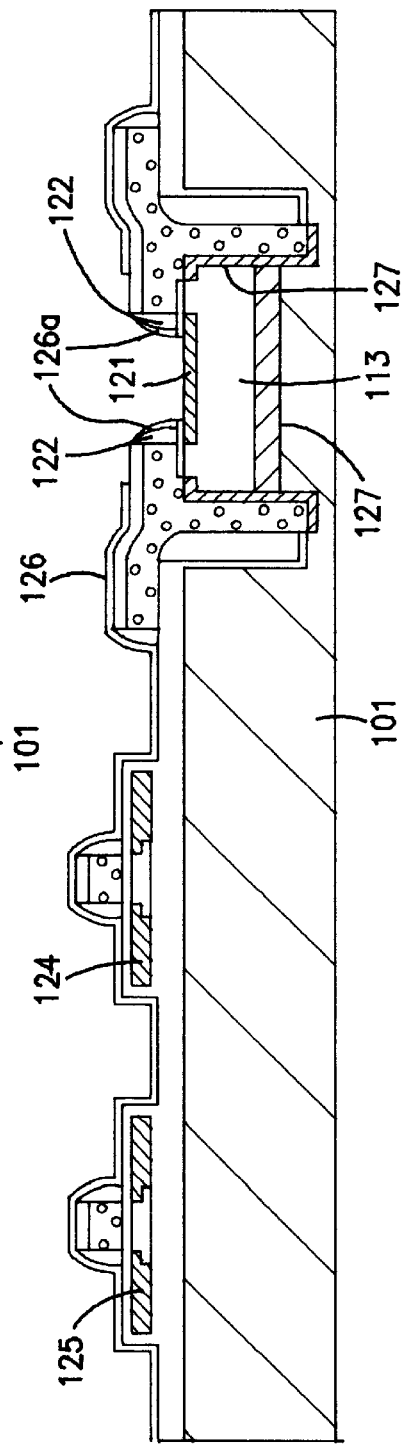
Figure 7L:
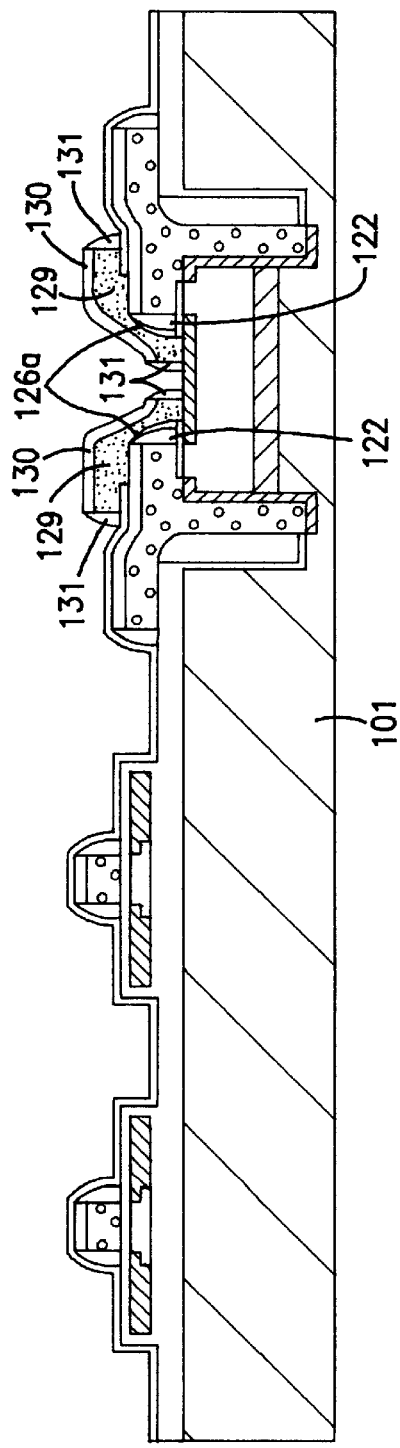
Figure 7M:
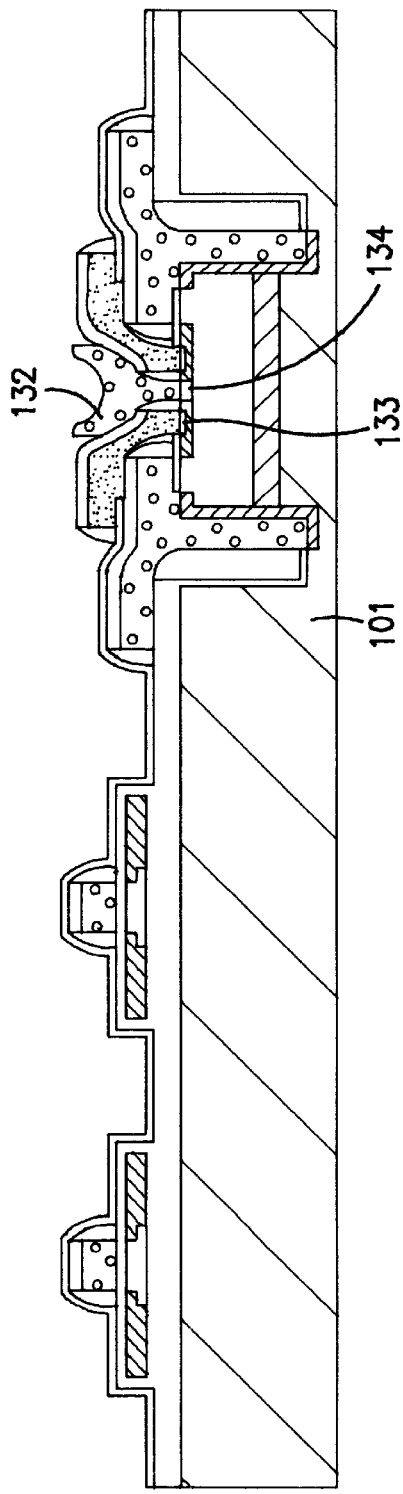
Figure 7N:
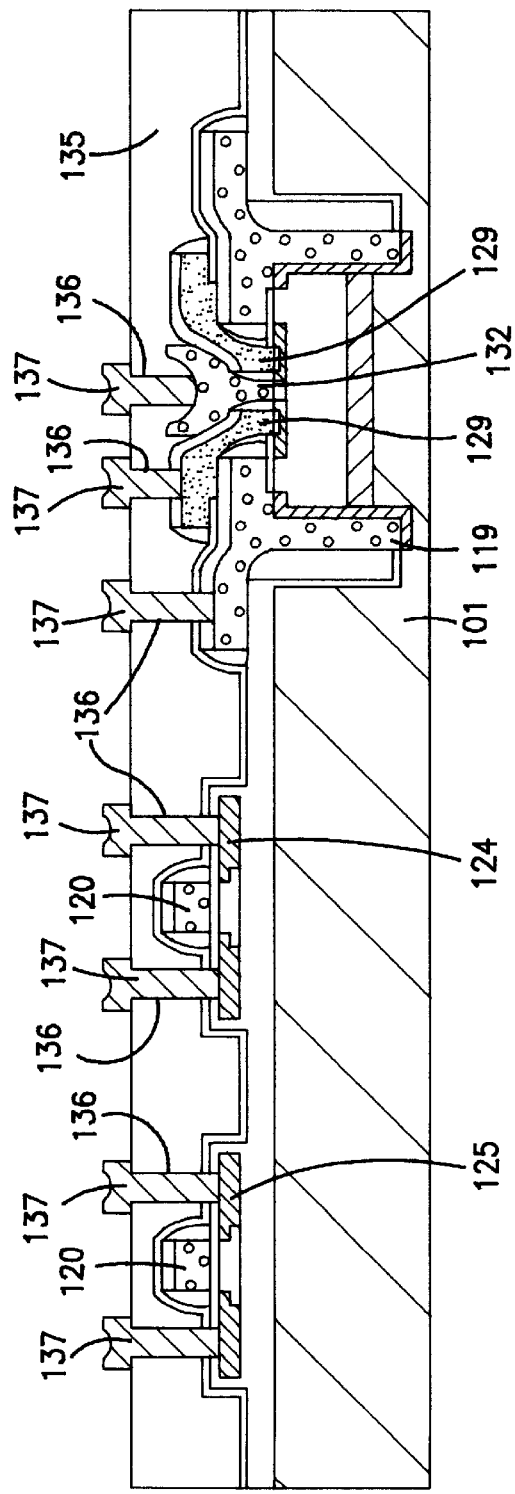

FIGS. 7 through 7N are fragmentary cross sectional elevation view illustrative of an improved bipolar transistors in sequential steps involved in a novel fabrication method therefor in a second embodiment according to the present invention.

PREFERRED EMBODIMENTS

A first embodiment according to the present invention will be described with reference to FIGS. 3A and 3B. The bipolar transistor is formed over a p-type semiconductor substrate 1. Field oxide films 5 are selectively formed on a surface of the p-type semiconductor substrate 1. Trench isolations 9 are formed in trench grooves 7 formed in the p-type semiconductor substrate 1 along edges of the field oxide films 5. The trench isolations 9 are made of silicon dioxide. The trench isolations 9 encompass an active region in which the bipolar transistor is formed. An n+ burying layer 10 is formed in a deep portion of the p-type semiconductor substrate 1. The n+ burying layer 10 laterally extends but is encompassed by the trench isolations 9. The bottom of the trench isolations 9 is deeper than the bottom of the n+ burying layer 10. Collector plug electrodes 19 are formed, which comprises a horizontal portion laterally extending over the trench isolations 9 and outer portions of the active region encompassed by the trench isolations 9, and a vertical portion vertically extending along inside portions of the trench isolations 9. The vertical portions of the collector plug electrodes 19 are formed within contact holes 16 which have been formed along inside portions of the trench isolations 9 in the vertical direction from the top portion of the trench isolations 9 to a deeper portion but shallower than the bottom of the trench isolations 9. The bottom of the vertical portion of the collector plug electrodes 19 is positioned at almost an intermediate level of the n+ burying layer 10. The inside edge of the vertical portion of the collector plug electrodes 19 is aligned to the inside edge of the trench isolations 9. Collector diffusion layers 27 are formed, which vertically extend along the inside walls of the vertical portions of the collector plug electrodes 19. The top of the collector diffusion layers 27 is positioned at the same level as the top of the vertical portion of the collector plug electrodes 19. The bottom of the collector diffusion layers 27 is also positioned at the same level as the bottom of the vertical portion of the collector plug electrodes 19. The collector diffusion layers 27 laterally encompass an n-well region 11 which is positioned over the n+ burying layer 10. An intrinsic base region 21 is selectively formed in an upper region of the n-well region 11. The intrinsic base region 21 is separated by the n-well region 11 from the collector diffusion layers 27 in the lateral direction and from the n+ burying layer 10 in the vertical direction. A graft base layer 34 is formed at a center portion of the intrinsic base region 21. A base plug electrode 32 is formed in contact with the graft base layer 34. A ring-shaped emitter 33 is formed in an upper portion of the intrinsic base region 21. Emitter plug electrodes 29 are formed in contact with the ring-shaped emitter 33. The emitter plug electrodes 29 are separated by silicon oxide films from the collector plug electrodes 19. An inter-layer insulator 35 is formed over the bipolar transistor. Contact holes 36 are selectively formed in the inter-layer insulator 35. Electrode interconnections 37 are formed within the contact holes 36 formed in the inter-layer insulator 35 so that the electrode interconnections 37 are in contact with the collector plug electrodes 19, the base plug electrode 32 and the emitter plug electrodes 29 respectively.

As described above, the collector diffusion layers 27 vertically extend along the inside walls of the vertical portions of the collector plug electrodes 19. The collector diffusion layers 27 surround in the horizontal direction the n-well region 11. The collector diffusion layers 27 are formed by a thermal diffusion of impurity toward the n-well region 11 from the vertical portions of the collector plug electrodes 19, for which reason a thickness of the collector diffusion layers 27, namely a lateral size thereof may be controlled in the range of approximately 0.3 micrometers to approximately 0.5 micrometers. The collector diffusion layers 27 extend vertically from the same level as the top of the n-well region 11 to the same level as the intermediate portion of the n+ burying layer 10 so that the collector plug electrode 19 is connected via the collector diffusion layers 27 to the n+ burying layer 10. The collector plug electrode 19 has an impurity concentration in the range of $1\times10^{19}$ atoms/cm$^3$ to $1\times10^{20}$ atoms/cm$^3$. The n-well region 11 has an impurity concentration in the range of $1\times10^{16}$ atoms/cm$^3$ to $1\times10^{17}$ atoms/cm$^3$. The impurity concentration of the collector diffusion layers 27 varies in the lateral direction. The impurity concentration of the collector diffusion layers 27 drops in a lateral direction toward the n-well region 11 from the same level as the collector plug electrode 19 into the n-well region 11. The depth of the n+ burying layer 10 is so determined that when the bipolar transistor is in an active state, then a space charge region formed under the intrinsic base region 21 extends to reach the n⁺ burying layer 10. When the bipolar transistor enters into the on state, then a current flows from the collector plug electrode 19 through the collector diffusion layers 27 into the n⁺ burying layer 10. Since the impurity concentration of the collector diffusion layers 27 is higher at an interface to the inside wall of the vertical portion of the collector plug electrode 19, the majority of the current flows through the collector diffusion layers 27 in a high impurity concentration region thereof near the interface thereof to the collector plug electrode 19. Subsequently, the current laterally flows through the n⁺ burying layer 10 and then flows upwardly through the space charge region formed over the n⁺ burying layer 10 and under the intrinsic base region 21 to the intrinsic base region 21. The collector plug electrode 19, the collector diffusion layers 27, and the n⁺ burying layer 10 have high impurity concentrations. The current path comprises the collector plug electrode 19, the collector diffusion layers 27, and the n⁺ burying layer 10 and further the space charge region, for which reason the collector series resistance is substantially reduced. FIG. 5 is a view showing a reduced collector series resistance of the above improved bipolar transistor in accordance with the present invention as compared to collector series resistances of the two conventional bipolar transistors illustrated in FIGS. 1A, 1B, 2A and 2B. The collector series resistance of the improved bipolar transistor in accordance with the present invention is one tenth of that of the first conventional bipolar transistor illustrated in FIGS. 1A and 1B and is one fourth of that of the second conventional bipolar transistor illustrated in FIGS. 2A and 2B.

The existence of the collector diffusion layers 27 ensures a sufficiently large section area for the current path between the collector plug electrode 19 and the n⁺ burying layer 10. This suppresses any increase in the collector series resistance of the bipolar transistor.

Further, as described above, in accordance with the present invention, the thickness of the collector diffusion layer 27, namely the horizontal size of the collector diffusion layer 27 may be limited in the range of about 0.3 micrometers to 0.5 micrometers. This allows the collector plug electrode 19 is to be formed relatively near the intrinsic base region 21 so that the collector diffusion layer 27 may approach the intrinsic base region 21 in the lateral direction by a distance in the range of 0.8 micrometers to 0.4 micrometers as compared to that of the conventional bipolar transistor. This may reduce the lateral size of the bipolar transistor by 20% to 30% as compared to the conventional bipolar transistor. By contrast, in the second conventional bipolar transistor illustrated in FIGS. 2A and 2B, the horizontal size of the collector diffusion layer 306 is 1.2 micrometers to 0.9 micrometers when the depth of the n⁺ burying layer 302 from the surface of the substrate is 1.5 micrometers.

The above improved bipolar transistor may be fabricated as follows, wherein the above described invention may be applied to a BiCMOS device.

With reference to FIG. 4A, an oxide film 5 having a thickness of 10–50 nanometers is formed on a surface of the p-type semiconductor substrate 1. A photo-resist mask is selectively formed over the oxide film 5 to be used for ion implantation of boron at a dose in the range of $1 \times 10^{12}$ atoms/cm³ to $1 \times 10^{13}$ atoms/cm³ at an acceleration energy in the range of 150 keV to 300 keV. The used photo-resist mask is then removed and in place another photo-resist mask is selectively provided over the oxide film 5 to be used for another ion implantation of phosphorus at a dose in the range of $1 \times 10^{12}$ atoms/cm³ to $1 \times 10^{13}$ atoms/cm³ at an acceleration energy in the range of 300 keV to 900 keV. The substrate 1 is subjected to a heat treatment in the nitrogen atmosphere at a temperature in the range of 1000° C. to 1100° C. for sixty minutes to thereby selectively form an n-type well region 3 and a p-type well region adjacent to the n-type well region 3 in the p-type semiconductor substrate 1. Thereafter, the used photo-resist mask is removed. A nitride film not illustrated and having a thickness in the range of 100–150 nanometers is formed over the oxide film 2. The nitride film is then selectively removed by a photo-etching technique. The remaining nitride film is used as a mask for a selective thermal oxidation to selectively form field oxide films 5 having a thickness in the range of 400–600 nanometers. The remaining nitride film is then removed.

With reference to FIG. 4B, a nitride film 6 having a thickness in the range of 50–100 nanometers is formed on an entire surface of the substrate. The nitride film 6 and the oxide film 2 are then selectively removed by a photo-etching technique. Subsequently, the p-type semiconductor 1 is then removed by a reactive ion etching which uses Cl₂/Ar/He mixing gases to form trench grooves 7. The nitride film is used as a mask for subsequent thermal oxidation to form oxide films 8 having a thickness in the range of 20–50 nanometers on vertical walls and bottoms of the trench grooves 7 formed in the -type semiconductor substrate 1.

With reference to FIG. 4C, an oxide film 9 is deposited by a chemical vapor deposition method so that the oxide film 9 extends entirely over the nitride film 6 and also within the trench grooves 7.

With reference to FIG. 4D, an anisotropic etching such as reactive ion etching to the oxide film 9 is then carried out to leave the oxide film 9 only within the trench grooves 7. In this etching process, it is preferable that a selective ratio to the nitride film is 40–50, namely an etching rate of the oxide film 9 is forty times to fifty times of the etching rate of the nitride film 6. It is, for example, available that CO/CHF₃ mixing gases are used to carry out the reactive ion etching so as to easily leave the oxide film 9 only within the trench grooves 7.

With reference to FIG. 4E, a hot phosphorus acid is used to remove the nitride film 6. A photolithography is used to form a photo-resist film having an opening which is positioned over a region surrounded by the trench grooves within which the remaining oxide films 9 are present. The photo-resist film is used as a mask for ion implantation of phosphorus at an acceleration energy of 1 MeV and a dose of $1 \times 10^{14}$ atoms/cm² to form an n⁺ burying layer 10 at a deep portion in the p-type semiconductor substrate 1. The above photo-resist film is again used as a mask for further ion implantation of phosphorus at an acceleration energy of 400 keV and a dose of $1 \times 10^{13}$ atoms/cm² to form an n-well region 11 over the n⁺ burying layer 10.

With reference to FIG. 4F, on a p-MOS region 12, phosphorus is ion-implanted into the n-well region 3 to adjust a threshold voltage. On an n-MOS region 13, boron is ion-implanted into the p-well region 4 adjust a threshold voltage. The oxide films 2 are removed to have the n-well region 3 and the p-well region 4 exposed as well as have the n-well region 11 exposed in a bipolar transistor region 14. A steam oxidation is carried out at a temperature of 800°–900° C. to form gate oxide films 15 having a thickness in the range of 5–10 nanometers over the n-well region 3 and the p-well region 4 as well as over the n-well region 11.

With reference to FIG. 4G, a photo-etching technique is used to selectively remove the oxide film 15 over the oxide films 9 within the trench grooves 7 and end portions of the n-well region 11 to expose the oxide films 9 and the end portions of the n-well region 11. The oxide films 9 and the oxide film 8 are selectively etched by an anisotropic etching such as a reactive ion etching to form contact holes 16 within the oxide films 9 but in the vicinity of the n-well region 11. The contact holes 16 vertically extend to the intermediate level in depth of the n⁺ burying layer 10. It is advantageously possible that a photo-mask alignment for forming the contact holes 16 may be made to align the opening of the photo-mask to extend side edges of the n-well region 11, for example, by 0.1–0.2 micrometers so that even if the photo-mask alignment has a slight displacement, then the side edges of the n⁺ burying layer 10 is securely exposed through the contact holes 16.

With reference to FIG. 4H, a polysilicon film 17 is entirely formed over the substrate so that the polysilicon film 17 extends over the gate oxide films 15, the field oxide films 5 and the top portions of the oxide films 9 within the trench grooves 7 and further within the contact holes 16 whereby the polysilicon film 17 is made into contact with the upper half portion of the side edges of the n⁺ burying layer 10. This polysilicon film 17 may be formed by a chemical vapor deposition method until the polysilicon film 17 has a thickness of 200 nanometers and subsequent ion implantation of n-type impurity such as phosphorus at an acceleration energy of 30 keV and at a dose of $1 \times 10^{16}$ atoms/cm². This polysilicon film 17 may be replaced by a polyside film. Alternatively, it may be possible that the impurity may be introduced into the polysilicon film during the deposition of the polysilicon film 17. An inter-layer insulator 18 having a thickness of approximately 200 nanometers is then formed by a chemical vapor deposition. The inter-layer insulator 18 may be made of either silicon oxide or silicon nitride.

With reference to FIG. 4J, the polysilicon film 17 and the inter-layer insulator 18 are selectively removed by a photo-etching technique to form collector plug electrodes 19 and gate electrodes 20. An intrinsic base region 21 is formed by an ion implantation of boron at an acceleration energy of 20 keV and at a dose of $5 \times 10^{13}$ cm⁻² in a self-alignment method using the remaining inter-layer insulator 18 and the collector plug electrodes 19 as masks.

With reference to FIG. 4J, an insulation film made of either silicon oxide or silicon nitride is entirely formed over the substrate and then an anisotropic etching such as reactive ion etching is carried out to form side walls 22 at the sides of the gate electrode 20 and the sides of the collector plug electrodes. Oxide films 23 having a thickness of 10–20 nanometers are formed. A photo-resist film is used for subsequent ion implantation of arsenic at an acceleration energy of 50 keV an at a dose of $5 \times 10^{15}$ cm⁻² to form source/drain regions 24 in the p-well region 4. The photo-resist film is removed and in place another photo-resist film is then formed for further ion implantation of $BF_2$ at an acceleration energy of 50 keV an at a dose of $5 \times 10^{15}$ cm⁻² to form source/drain regions 25 in the n-well region 3. Alternatively, it is possible that prior to the formation of the side walls 22, preliminary ion implantation of arsenic and $BF_2$ at the acceleration energy of 50 keV but at a dose of $1 \times 10^{13}$ cm⁻² to form lightly doped diffusion structures. It is further possible that the formation of the intrinsic base region 21 is formed after the side walls 22 are formed whereby the emitter diffusion regions may be formed within the intrinsic base region 21 due to a difference in diffusion coefficient between boron and arsenic.

With reference to FIG. 4K, an oxide film 26 having a thickness of 150 nanometers is entirely formed by a chemical vapor deposition method. An annealing is carried out in a nitrogen atmosphere at a temperature in the range of 850°–900° C. for 30 minutes to activate the impurities in the source/drain regions 24 and 25 as well as in the intrinsic base region 21 and further obtain a recovery of damages caused by the ion-implantation as well as cause an impurity diffusion from the vertical portion of the collector plug electrode 19 to the side portions of the n-well region 11 to thereby form the collector diffusion region 27. As a result, the collector plug electrode 19 is connected via the collector diffusion region 27 to the n⁺ burying layer 10. The junction depth of the collector diffusion region 27, namely the thickness of the collector diffusion region 27, in other words the horizontal size of the collector diffusion region 27 may be limited in the range of 0.3–0.5 micrometers. The junction depth of the intrinsic base region 21, namely the thickness of the intrinsic base region 21 becomes 100–150 nanometers.

With reference to FIG. 4L, a photo-resist film 28 is entirely formed over the substrate for subsequent photo-lithography to form an opening which positioned over the bipolar transistor region, or a region inside the collector diffusion region 27. An anisotropic etching such as a reactive ion etching is carried out using the photo-resist film 28 as a mask to selectively remove the oxide film 26 so as to form side wall oxide films 26a adjacent to the side wall oxide films 22.

With reference to FIG. 4M, a polysilicon film having a thickness of 200 nanoemters is entirely formed over the substrate. An n-type impurity such as arsenic is implanted into the polysilicon film at an acceleration energy of 70 keV and at a dose of $1 \times 10^{16}$ atoms/cm². An inter-layer insulator 30 is entirely formed over the impurity doped polysilicon film. The inter-layer insulator 30 and the impurity doped polysilicon film are patterned by a photo-etching technique under conditions, for example, $SiCl_4$ of 15 scc, and $SF_6$ of 5 sccm and 500 W to form the emitter plug electrode 29.

With reference to FIG. 4N, an insulation film made of either silicon oxide or silicon nitride is formed by a chemical vapor deposition method. The insulation film is then selectively removed by an anisotropic etching such as a reactive ion etching to form side walls 31 on opposite side walls of the emitter plug electrode 29 and the inter-layer insulator 30. A polysilicon film having a thickness of 200 nanometers is entirely formed over the substrate by a chemical vapor deposition method. An ion implantation of $BF_6$ into the polysilicon film is carried out at a dose of $5 \times 10^{15}$ atoms/cm² and an acceleration energy of 50 keV. The boron doped polysilicon film is then patterned by a photo-etching technique under conditions, for example, $SiCl_4$ of 15 scc, and $SF_6$ of 5 sccm and 500 W to form the base plug electrode 32. A heat treatment to the substrate is carried out at a temperature of 850°–900° C. for about 20 minutes to cause impurity diffusion from the base plug electrode 32 into the intrinsic base region 21 as well as from the emitter plug electrodes 29 into the intrinsic base region 21 to thereby form the graft base region 34 at a center portion of the intrinsic base region 21 as well as form the ring-shaped emitter diffusion region 33 in an upper portion of the intrinsic base region 21.

With reference to FIG. 4O, an inter-layer insulator 35 is entirely formed over the substrate wherein the inter-layer insulator 35 may, for example, comprise laminations of an oxide film and a boron phosphate silicate glass film. Contact holes 36 are selectively formed which achieve the base plug electrode 32, the emitter plug electrode 29, the collector plug electrode 19 and the source/drain regions 24 and 25. An aluminum alloy is deposited by sputtering method by a sputtering method to be patterned to form electrode interconnections 37 within the contact holes 36.

In accordance with the above process, the base region and the emitter plug electrode are formed in self-alignment to the collector plug electrode. The collector plug electrode and the gate electrodes are simultaneously formed to reduce fifteen processes in the fabrication methods.

Described with reference to FIG. 6. The improved bipolar transistor structurally differs from that of the first embodiment both in forming the CMOS transistors over a silicon on insulator substrate and in the bottom of the vertical portion of the collector plug electrode being positioned at the same level as the bottom of the trench groove as well as the collector diffusion layers extend not along the inner side walls but also under the bottom of the vertical portion of the collector plug electrode so that the collector diffusion layers vertically extend to a deeper level than the bottom of the n$^+$ burying layer, As a result, entire side portions of the n$^+$ burying layer are in contact with the collector diffusion layers to ensure a sufficient large area of the interface between the collector diffusion layers and the n$^+$ burying layer thereby reducing the collector series resistance.

When the bipolar transistor is in the on state, the current flows from the collector plug electrode 119 through the collector diffusion layers 127 to the n$^+$ burying layer 112. The current then flows upwardly from the n$^+$ burying layer 112 to the intrinsic base region 121 though a space charge region formed under the intrinsic base region 121 and over the n$^+$ burying layer 112. The collector plug electrodes 119, the collector diffusion layers 127, and the n$^+$ burying layer 112 have high impurity concentrations. The current path comprises the collector plug electrodes 119, the collector diffusion layers 127, and the n$^+$ burying layer 112 and further the space charge region, for which reason the collector series resistance is substantially reduced.

The existence of the collector diffusion layers 27 ensures a sufficiently large section area for the current path between the collector plug electrodes 19 and the n$^+$ burying layer 10. This suppresses any increase in the collector series resistance of the bipolar transistor.

Further, the thickness of the collector diffusion layer 127, namely the horizontal size of the collector diffusion layer 127 may be limited in the range of about 0.3 micrometers to 0.5 micrometers. This allows that the collector plug electrodes 119 is formed relatively near the intrinsic base region 121 so that the collector diffusion layer 127 may approach toward the intrinsic base region 121 in the lateral direction by a distance in the range of 0.8 micrometers to 0.4 micrometers as compared to that of the conventional bipolar transistor. This may reduce the lateral size of the bipolar transistor by 20% to 30% as compared to the conventional bipolar transistor as illustrated in FIGS. 2A and 2B.

The above improved bipolar transistor may be fabricated as follows. With reference to FIG. 7A, a burying oxide film 102 hating a thickness of 300–500 nanometers is entirely formed on a p-type semiconductor substrate 101. A semiconductor layer 103 having a thickness of 50–150 nanometers is entirely formed over the burying oxide film 102. An oxide film 104 having a thickness of 20–50 nanometers is formed over the semiconductor layer 103 by a chemical vapor deposition method or a thermal oxidation. The oxide film 104, the semiconductor layer 103 and the burying oxide film 102 are selectively removed by a photo-etching technique to expose the p-type semiconductor substrate 101 in a bipolar transistor region.

With reference to FIG. 7B, an oxide film 105 having a thickness of 20–50 nanometers is formed by a steam thermal oxidation at a temperature of 800°–900° C. over the exposed surface of the p-type semiconductor substrate 101 and the side walls of the semiconductor layer 103. A nitride film 106 having a thickness of 50–100 nanometers is entirely formed over the substrate by a chemical vapor deposition.

With reference to FIG. 7C, a photo-lithography is used to form a photo-resist film 107 with openings which is then used as a mask for selective etching of the nitride film 106 and the oxide film 105 and further selective etching to an upper portion of the p-type semiconductor substrate 101 to form trench grooves 108. The burying oxide film 102 serves as a mask for the etching, for which reason even if the opening of the photo-resist film 107 extends outside the edge of the burying oxide film 102, then the outer side walls of the trench grooves are defined by the edges of the burying oxide film 102. The above etching may be carried out under conditions of SiCl$_4$ of 15 sccrn, SF$_6$ of 5 sccm, and 500 W. It may be possible to use Cl$_2$/Ar/He mixture gas.

With reference to FIG. 7D, the used photo-resist film 107 is removed. The nitride film 106 is used as a mask to carry out a steam thermal oxidation at a temperature of 800°–900° C. to form an oxide film 109 on the vertical walls and the bottom of the trench grooves 108. An oxide film 110 having a thickness of 300–500 nanometers is entirely formed by a chemical vapor deposition. An anisotropic etching such as a reactive ion etching to the oxide film 110 is carried out to leave the oxide film 110 within the trench grooves 108, wherein an upper surface of the oxide film 110 is sloped from the top level of the burying oxide film 102 at the outside edge portion to a top level of the oxide film 105 at the inside portion. This etching is carried out under a condition that the etching rate of oxide film to nitride film is sufficiently larger, for example, by use of CO/CBF$_3$ mixture gas.

With reference to FIG. 7F, a hot phosphorus acid is used to remove the nitride film 106. An ion implantation of n-type impurity such as phosphorus is carried out at a high acceleration energy of 1 MeV and at a dose of 1×10$^{14}$ atoms/cm$^2$ to form an n$^+$ burying layer 112 on a bipolar transistor region surrounded by the trench grooves 108. Subsequently an ion implantation of n-type impurity such as phosphorus is carried out at a high acceleration energy of 400 keV and at a dose of 1×10$^{14}$ atoms/cm$^2$ to form an n-well layer 113 over the n$^+$ burying layer 112. A photo-etching technique is used to selectively remove the semiconductor layer 103 and the oxide film 104. Alternatively, it may be possible that a nitride film is used as a mask for a selective thermal oxidation of the semiconductor layer 103 to form field oxide films by a local oxidation of silicon.

With reference to FIG. 7G, on a p-MOS region 114, an ion implantation of phosphorus into the remaining semiconductor layer 103 is carried out to adjust a threshold voltage. On an n-MOS region 115, an ion implantation of boron into the remaining semiconductor layer 103 is carried out to adjust a threshold voltage. The oxide film 104 is then removed to expose the semiconductor layers 103. A steam thermal oxidation is carried out at a temperature of 800°–900° C. to form a gate oxide film 116 over the semiconductor layers 103 and on the opposite sides of the semiconductor layers 103. Further, the gate oxide film 116 is formed over the n-well region 113 on the bipolar transistor region 111.

With reference to FIG. 7H, the oxide film 110 within the trench groove is selectively removed by an anisotropic etching such as a reactive ion etching to form contact holes 117 which vertically extends to the bottom of the trench grooves 108 so that the side edges of the n$^+$ burying layer 112 are exposed to the contact holes 117.

With reference to FIG. 7I, a polysilicon film having a thickness of 200 nanometers is entirely formed by a chemical vapor deposition. An ion implantation of n-type impurity such as phosphorus into the polysilicon film is carried out at an acceleration energy of 30 keV and at a dose of $1\times10^{16}$ atoms/cm$^2$. Alternatively, the impurity may be introduced into the polysilicon film during the growth of the polysilicon film. An inter-layer insulator 118 made of silicon oxide or silicon nitride is then entirely formed over the impurity doped- polysilicon film by a chemical vapor deposition method. The polysilicon film and the inter-layer insulator 118 are selectively by a photo-etching technique to form collector plug electrodes 119 and gate electrodes 120. An intrinsic base region 21 is formed by an ion implantation of boron at an acceleration energy of 20 keV and at a dose of $5\times10^{13}$ cm$^{-2}$ in a self-alignment method using the remaining inter-layer insulator 18 and the collector plug electrodes 119 as masks.

With reference to FIG. 7J, an insulation film made of either silicon oxide or silicon nitride is entirely formed over the substrate and then an anisotropic etching such as reactive ion etching is carried out to form side walls 122 at the sides of the gate electrode 120 and the sides of the collector plug electrodes 119. Oxide films 123 having a thickness of 10–20 nanometers are formed. A photo-resist film is used for subsequent ion implantation of arsenic at an acceleration energy of 50 keV an at a dose of $5\times10^{15}$ cm$^{-2}$ to form source/drain regions 124 in the n-MOS region 115. The photo-resist film is removed and in place another photo-resist film is then formed for further ion implantation of $BF_2$ at an acceleration energy of 50 keV an at a dose of $5\times10^{15}$ cm$^{-2}$ to form source/drain regions 125 in the p-MOS region 114. Alternatively, it is possible that prior to the formation of the side walls 122, preliminary ion implantation of arsenic and $BF_2$ at the acceleration energy of 50 keV but at a dose of $1\times10^{13}$ cm$^{-2}$ to form lightly doped diffusion structures. It is further possible that the formation of the intrinsic base region 121 is formed after the side walls 122 are formed whereby the emitter diffusion regions may be formed within the intrinsic base region 121 due to a difference in diffusion coefficient between boron and arsenic.

With reference to FIG. 7K, an oxide film 126 having a thickness of 150 nanometers is entirely formed by a chemical vapor deposition method. An annealing is carried out in a nitrogen atmosphere at a temperature in the range of 850°–900° C. for 30 minutes to activate the impurities in the source/drain regions 124 and 125 as well as in the intrinsic base region 121 and further obtain a recovery of damages caused by the ion-implantation as well as cause an impurity diffusion from the vertical portion of the collector plug electrode 119 to the side portions of the n-well region 113 to thereby form the collector diffusion region 127. As a result, the collector plug electrode 119 is connected via the collector diffusion region 127 to the n$^+$ burying layer 112. The junction depth of the collector diffusion region 127, namely the thickness of the collector diffusion region 127, in other words the horizontal size of the collector diffusion region 127 may be limited in the range of 0.3–0.5 micrometers. The junction depth of the intrinsic base region 121, namely the thickness of the intrinsic base region 121 becomes 100–150 nanometers. A photo-resist film 128 is entirely formed over the substrate for subsequent photo-lithography to form an opening which positioned over the bipolar transistor region, or a region inside the collector diffusion region 127. An anisotropic etching such as a reactive ion etching is carried out using the photo-resist film 128 as a mask to selectively remove the oxide film 126 so as to form side wall oxide films 126a adjacent to the side wall oxide films 122.

With reference to FIG. 7L, a polysilicon film having a thickness of 200 nanoemters is entirely formed over the substrate. An n-type impurity such as arsenic is implanted into the polysilicon film at an acceleration energy of 70 keV and at a dose of $1\times10^{16}$ atoms/cm$^2$. An inter-layer insulator 130 is entirely formed over the impurity doped polysilicon film. The inter-layer insulator 130 and the impurity doped polysilicon film are patterned by a photo-etching technique under conditions, for example, SiCl$_4$ of 15 scc, and SF$_6$ of 5 sccm and 500 W to form the emitter plug electrode 129. An insulation film made of either silicon oxide or silicon nitride is formed by a chemical vapor deposition method. The insulation film is then selectively removed by an anisotropic etching such as a reactive ion etching to form side walls 131 on opposite side walls of the emitter plug electrode 129 and the inter-layer insulator 30.

With reference to FIG. 7M, a polysilicon film having a thickness of 200 nanometers is entirely formed over the substrate by a chemical vapor deposition method. An ion implantation of BF$_6$ into the polysilicon film is carried out at a dose of $5\times10^{15}$ atoms/cm$^2$ and an acceleration energy of 50 keV. The boron doped polysilicon film is then patterned by a photo-etching technique under conditions, for example, SiCl$_4$ of 15 scc, and SF$_6$ of 5 sccm and 500 W to form the base plug electrode 132. A heat treatment to the substrate is carried out at a temperature of 850°–900° C. for about 20 minutes to cause impurity diffusion from the base plug electrode 132 into the intrinsic base region 121 as well as from the emitter plug electrodes 129 into the intrinsic base region 121 to thereby form the graft base region 134 at a center portion of the intrinsic base region 121 as well as form the ring-shaped emitter diffusion region 133 in an upper portion of the intrinsic base region 121.

With reference to FIG. 7N, an inter-layer insulator 135 is entirely formed over the substrate wherein the inter-layer insulator 135 may, for example, comprise laminations of an oxide film and a boron phosphate silicate glass film. Contact holes 136 are selectively formed which achieve the base plug electrode 132, the emitter plug electrode 129, the collector plug electrode 119 and the source/drain regions 124 and 125. An aluminum alloy is deposited by sputtering method by a sputtering method to be patterned to form electrode interconnections 137 within the contact holes 36.

In accordance with the above process, the base region and the emitter plug electrode are formed in self-alignment to the collector plug electrode. The collector plug electrode and the gate electrodes are simultaneously formed to reduce fifteen processes in the fabrication methods.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A collector structure in a bipolar transistor which is formed on a semiconductor substrate and is surrounded by trench isolations, the collector structure comprising:

a well region having a first impurity concentration and extending in an upper portion of the semiconductor substrate surrounded by the trench isolations, the well region is of a first conductivity type and has a base region formed thereon, the base region including an emitter region;

a burying layer laterally extending under the well region, the burying layer being the first conductivity type and having a second impurity concentration higher than the first impurity concentration, and the burying layer being positioned shallower than the bottom of the trench isolations;

collector plug electrodes extending at least in a vertical direction and along inside walls of the trench isolations, the collector plug electrodes being the first conductivity type and having a third impurity concentration higher than the first impurity concentration, the collector plug electrodes having a bottom level which is at the same level as the bottom of the trench isolations; and a collector diffusion layer extending in a vertical direction and along inside vertical walls of the collector plug electrodes, the collector diffusion layer having a bottom level which extends horizontally beneath the bottom of the collector plug electrodes so that the bottom of the collector diffusion layer is deeper than the bottom of the trench isolations so as to have the collector diffusion layer contact the burying layer.

* * * * *